(12) United States Patent
Kung et al.

(10) Patent No.: US 12,464,790 B2
(45) Date of Patent: Nov. 4, 2025

(54) SEMICONDUCTOR STRUCTURE

(71) Applicants: TAIWAN SEMICONDUCTOR MANUFACTURING COMPANY LTD., Hsinchu (TW); NATIONAL CHENG KUNG UNIVERSITY, Tainan (TW)

(72) Inventors: Te-Ming Kung, Taichung (TW); Ying-Lang Wang, Tai-Chung (TW); Kei-Wei Chen, Tainan (TW); Wen-Hsi Lee, Kaohsiung (TW); Shu Wei Chang, Kaohsiung (TW)

(73) Assignees: TAIWAN SEMICONDUCTOR MANUFACTURING COMPANY LTD.; NATIONAL CHENG KUNG UNIVERSITY

( * ) Notice: Subject to any disclaimer, the term of this patent is extended or adjusted under 35 U.S.C. 154(b) by 0 days.

(21) Appl. No.: 18/674,953

(22) Filed: May 27, 2024

(65) Prior Publication Data
US 2024/0313051 A1 Sep. 19, 2024

Related U.S. Application Data

(62) Division of application No. 17/574,563, filed on Jan. 13, 2022, now Pat. No. 12,021,117.

(60) Provisional application No. 63/280,354, filed on Nov. 17, 2021.

(51) Int. Cl.
*H01L 21/02* (2006.01)
*H01L 21/324* (2006.01)
*H10D 30/67* (2025.01)
*H10D 62/10* (2025.01)
(Continued)

(52) U.S. Cl.
CPC ..... *H10D 62/121* (2025.01); *H01L 21/02381* (2013.01); *H01L 21/0245* (2013.01); *H01L 21/02532* (2013.01); *H01L 21/324* (2013.01); *H10D 30/6735* (2025.01); *H10D 84/0128* (2025.01); *H10D 84/038* (2025.01)

(58) Field of Classification Search
CPC .... H10D 62/121; H10D 30/43; H10D 30/014; H10D 30/751; H10D 30/6757; H10D 84/0167; H01L 21/02381; H01L 21/0245; H01L 21/02532; H01L 21/02667; H01L 21/0251; Y10S 977/938
See application file for complete search history.

(56) References Cited

U.S. PATENT DOCUMENTS

2014/0034908 A1* 2/2014 Bangsaruntip ..... H10D 30/6757
257/27
2017/0110373 A1* 4/2017 Xiao ................. H10D 30/6739

* cited by examiner

*Primary Examiner* — Ajay Ojha
*Assistant Examiner* — Sandra Milena Rodriguez Villanu
(74) *Attorney, Agent, or Firm* — WPAT LAW; Anthony King

(57) ABSTRACT

A semiconductor structure includes a substrate, a nanowire disposed over the substrate, a metal gate electrode layer and a gate dielectric layer. A dielectric layer is formed on the substrate. The nanowire has a first portion and a second portion. The nanowire has a first portion and a second portion, the first portion of the nanowire comprises a first semiconductor layer and a second semiconductor layer surrounded by the first semiconductor layer, the second portion comprises the second semiconductor layer. The metal gate electrode layer surrounds the first portion of the nanowire. The gate dielectric layer is disposed between the metal gate electrode layer and the nanowire.

20 Claims, 19 Drawing Sheets

(51) Int. Cl.
*H10D 84/01* (2025.01)
*H10D 84/03* (2025.01)

10

Receiving a substrate including at least a silicon layer — 11

Forming an amorphous germanium layer on the silicon layer — 12

Annealing the substrate to transform the silicon layer and the germanium layer to form a silicon germanium layer — 13

FIG. 1

SEMICONDUCTOR STRUCTURE

PRIORITY DATA

This patent is a divisional application of U.S. patent application Ser. No. 17/574,563 filed on Jan. 13, 2022, entitled of "SEMICONDUCTOR STRUCTURE AND METHOD OF FORMING THE SAME", which claims the benefit of U.S. Provisional Patent Application Ser. No. 63/280,354 filed Nov. 17, 2021, the entire disclosure of which is hereby incorporated by reference.

BACKGROUND

In the semiconductor art, it is desirable to improve transistor performance even as devices become smaller with ongoing reductions in scale. Strain-induced band structure modification and mobility enhancement, which are used to increase drive current, represent an attractive approach to improving transistor performance. For example, enhanced electron mobility in silicon would improve performance of an n-type metal-oxide-semiconductor (nMOS) device while enhanced hole mobility in silicon germanium (SiGe) would improve performance of a p-type MOS (pMOS) device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 is a flow diagram of some embodiments of a method of forming a semiconductor structure according to aspects of the present disclosure in one or more embodiments.

FIGS. 8A to 8C are schematic drawings illustrating a semiconductor structure at a fabrication stage constructed according to aspects of the present disclosure in one or more embodiments, wherein FIG. 8B is a cross-sectional view taken along line I-I' in FIG. 8A, and FIG. 8C is a cross-sectional view taken along line II-II' in FIG. 8A.

FIGS. 9A to 9C are schematic drawings illustrating a semiconductor structure at various fabrication stages constructed according to aspects of the present disclosure in one or more embodiments, wherein FIG. 9A is a drawing illustrating a stage subsequent to FIG. 8A, FIG. 9B is a cross-sectional view taken along line I-I' in FIG. 9A, and FIG. 9C is a cross-sectional view taken along line in II-II' FIG. 9A.

FIGS. 10A to 10C are schematic drawings illustrating a semiconductor structure at various fabrication stages constructed according to aspects of the present disclosure in one or more embodiments, wherein FIG. 10B is a cross-sectional view taken along line I-I' in FIG. 10A, and FIG. 10C is a cross-sectional view taken along line II-II' in FIG. 10A.

FIGS. 12A to 12C are schematic drawings illustrating a semiconductor structure at a fabrication stage constructed according to aspects of the present disclosure in one or more embodiments, wherein FIG. 12B is a cross-sectional view taken along line I-I' in FIG. 12A, and FIG. 12C is a cross-sectional view taken along line II-II' in FIG. 12A.

FIGS. 13A to 13C are schematic drawings illustrating a semiconductor structure at a fabrication stage constructed according to aspects of the present disclosure in one or more embodiments, wherein FIG. 13A is a drawing illustrating a stage subsequent to FIG. 12A, FIG. 13B is a cross-sectional view taken along line I-I' in FIG. 13A, and FIG. 13C is a cross-sectional view taken along line II-II' in FIG. 13A.

FIGS. 14A to 14C are schematic drawings illustrating a semiconductor structure at a fabrication stage constructed according to aspects of the present disclosure in one or more embodiments, wherein FIG. 14A is a drawing illustrating a stage subsequent to FIG. 13A, FIG. 14B is a cross-sectional view taken along line I-I' in FIG. 14A, and FIG. 14C is a cross-sectional view taken along line II-II' in FIG. 14A.

FIGS. 15A to 15C are schematic drawings illustrating a semiconductor structure at a fabrication stage constructed according to aspects of the present disclosure in one or more embodiments, wherein FIG. 15A is a drawing illustrating a stage subsequent to FIG. 14A, FIG. 15B is a cross-sectional view taken along line I-I' in FIG. 15A, and FIG. 15C is a cross-sectional view taken along line II-II' in FIG. 15A.

FIGS. 16A to 16C are schematic drawings illustrating a semiconductor structure at a fabrication stage constructed according to aspects of the present disclosure in one or more embodiments, wherein FIG. 16A is a drawing illustrating a stage subsequent to FIG. 15A, FIG. 16B is a cross-sectional view taken along line I-I' in FIG. 16A, and FIG. 16C is a cross-sectional view taken along line II-II' in FIG. 16A.

FIGS. 17A to 17C are schematic drawings illustrating a semiconductor structure at a fabrication stage constructed according to aspects of the present disclosure in one or more embodiments, wherein FIG. 17A is a drawing illustrating a stage subsequent to FIG. 16A, FIG. 17B is a cross-sectional view taken along line I-I' in FIG. 17A, and FIG. 17C is a cross-sectional view taken along line II-II' in FIG. 17A.

FIGS. 18A to 18C are schematic drawings illustrating a semiconductor structure at a fabrication stage constructed according to aspects of the present disclosure in one or more embodiments, wherein FIG. 18A is a drawing illustrating a stage subsequent to FIG. 17A, FIG. 18B is a cross-sectional view taken along line I-I' in FIG. 18A, and FIG. 18C is a cross-sectional view taken along line II-II' in FIG. 18A.

FIGS. 19A to 19C are schematic drawings illustrating a semiconductor structure at a fabrication stage constructed according to aspects of the present disclosure in one or more embodiments, wherein FIG. 19A is a drawing illustrating a stage subsequent to FIG. 18A, FIG. 19B is a cross-sectional view taken along line I-I' in FIG. 19A, and FIG. 19C is a cross-sectional view taken along line II-II' in FIG. 19A.

FIGS. 20A to 20C are schematic drawings illustrating a semiconductor structure at a fabrication stage constructed according to aspects of the present disclosure in one or more embodiments, wherein FIG. 20A is a drawing illustrating a stage subsequent to FIG. 19A, FIG. 20B is a cross-sectional view taken along line I-I' in FIG. 20A, and FIG. 20C is a cross-sectional view taken along line II-II' in FIG. 20A.

FIGS. 21A to 21C are schematic drawings illustrating a semiconductor structure at a fabrication stage constructed according to aspects of the present disclosure in one or more embodiments, wherein FIG. 21A is a drawing illustrating a stage subsequent to FIG. 20A, FIG. 21B is a cross-sectional view taken along line I-I' in FIG. 21A, and FIG. 21C is a cross-sectional view taken along line II-II' in FIG. 21A.

DETAILED DESCRIPTION

Figure 2:
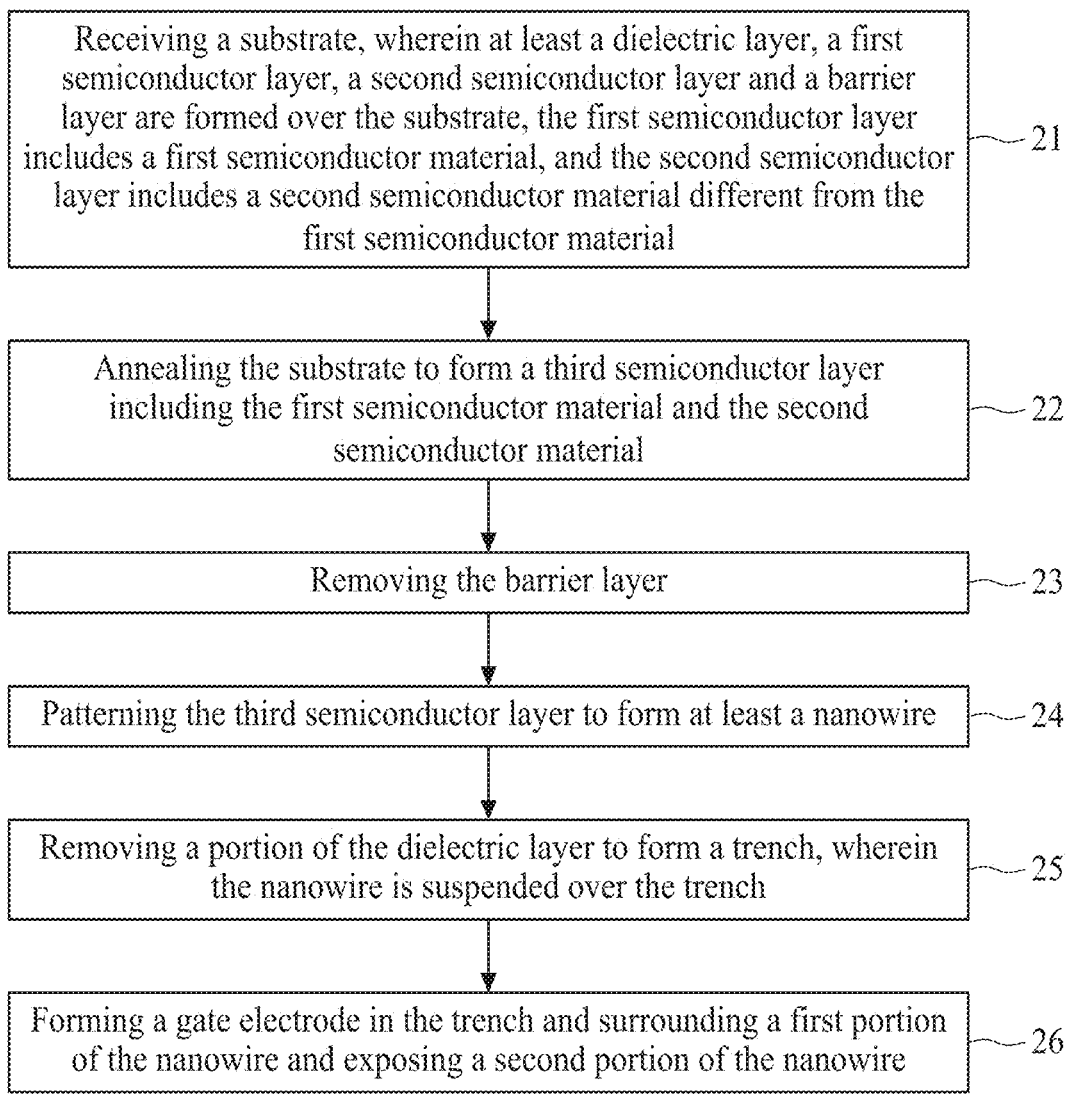
FIG. 2 is a flow diagram of some embodiments of a method of forming a semiconductor structure according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature on or over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of brevity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, portions, layers and/or sections, but these elements, components, portions, layers and/or sections should not be limited by these terms. These terms may be only used to distinguish one element, component, portion, layer or section from another. The terms such as "first," "second" and "third" when used herein do not imply a sequence or order unless clearly indicated by the context.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Gate-all-around (GAA) transistor structures may be patterned by any suitable method. For example, the GAA structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

SiGe is a semiconductor material which has a band gap that is smaller than that of silicon and that can be controlled by varying Ge content. SiGe used in combination with silicon produces a heterojunction that provides low junction leakage and high mobility. In some embodiments, metal oxide semiconductor field effect transistor (MOSFET) devices have a SiGe channel that extends between a source portion and a drain portion. A gate electrode, configured to control the flow of charge carriers from the source portion to the drain portion, is separated from the SiGe channel by a gate dielectric layer.

In some comparative approaches, a SiGe hetero-structure is formed using an epitaxial (EPI) growth operation or a chemical vapor deposition (CVD) operation. When a germanium (Ge) concentration of the SiGe hetero-structure is greater than 10%, for example, between approximately 20% and approximately 30%, an impurity defect and a strain issue caused by dislocation may easily occur in the SiGe formed by the EPI operation or the CVD operation.

To mitigate such problem, the present disclosure provides a method for forming a SiGe structure. In some embodiments, the SiGe structure is formed by forming an amorphous Ge layer on a Si layer. An anneal is subsequently performed. During the anneal, germanium atoms may diffuse into the silicon layer, thus forming a crystal SiGe structure. According to the method, the Ge concentration can be determined by a ratio of a thickness of the Ge layer to a thickness of the Si layer. The SiGe structure formed by the method may have less impurity defect. Further, the SiGe structure formed by the method has less dislocation issue, and may be a strain-relaxed structure.

It should be noted that the method for forming the SiGe structure can be integrated in planar transistor devices and non-planar transistor devices, such as tri-gate, FinFET and gall-all-around (GAA) architectures. It should also be noted that the present disclosure presents embodiments in the form of multi-gate transistors or fin-type multi-gate transistors referred to herein as FinFET devices. The FinFET devices may be GAA devices, Omega-gate (a-gate) devices, Pi-gate (H-gate) devices, dual-gate devices, tri-gate devices, bulk devices, silicon-on-insulator (SOI) devices, and/or other configurations. The GAA devices may include vertically stacked nanowires or horizontally arranged nanowires. One of ordinary skill may recognize other examples of semiconductor devices that may benefit from aspects of the present disclosure.

Further, the method for forming the SiGe structure of the present disclosure can also be integrated in a metal gate-last approach or a replacement-gate (RPG) approach.

FIG. 1 is a flow diagram of some embodiments of a method of forming a semiconductor structure 10, and FIGS. 3 to 6 are schematic drawings illustrating the method of forming the semiconductor structure 10 at various fabrication stages. The method 10 includes a number of operations (11, 12 and 13). The method 10 will be further described according to one or more embodiments. It should be noted that the operations of the method 10 may be rearranged or otherwise modified within the scope of the various aspects.

It should be further noted that additional processes may be provided before, during, and after the method 10, and that some other processes may be only briefly described herein. Thus, other implementations are possible within the scope of the various aspects described herein.

FIG. 2 is a flow diagram of some embodiments of a method of forming a semiconductor structure 20, and FIGS. 3 to 10C are schematic drawings illustrating the method of forming the semiconductor structure at various fabrication stages. The method 20 includes a number of operations (21, 22, 23, 24, 25 and 26). The method 20 will be further described according to one or more embodiments. It should be noted that the operations of the method 20 may be rearranged or otherwise modified within the scope of the various aspects. It should be further noted that additional processes may be provided before, during, and after the method 20, and that some other processes may be only briefly described herein. Thus, other implementations are possible within the scope of the various aspects described herein.

In some embodiments, the method 10 and the method 20 may be performed simultaneously.

Figure 3:
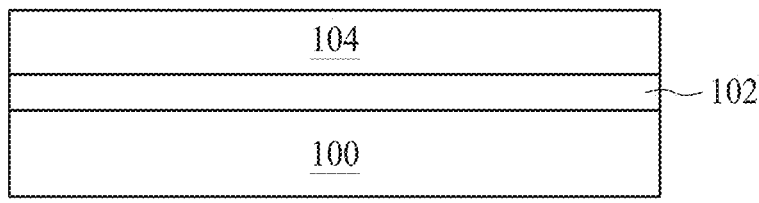
FIGS. 3 to 6 are schematic drawings illustrating the method of forming the semiconductor structure at various fabrication stages according to aspects of the present disclosure in one or more embodiments.

Referring to FIG. 3, in operations 11 and 21, a substrate 100 is received. In some embodiments the substrate 100 includes a silicon (Si) substrate. In other embodiments, the substrate 100 may include another elementary semiconductor, such as germanium (Ge); a compound semiconductor including silicon carbide (SiC), gallium arsenide (GaAs), gallium phosphide (GaP), indium phosphide (InP), indium arsenide (InAs), or indium antimonide (InSb); an alloy semiconductor including silicon germanium (SiGe), gallium arsenide phosphide (GaAsP), aluminum indium phosphide (AlInP), aluminum gallium arsenide (AlGaAs), gallium indium arsenide (GaInAs), gallium indium phosphide (GaInP), or gallium indium arsenide phosphide (GaInAsP); or a combination thereof.

In some embodiments a dielectric layer 102 is formed over the substrate 100. In some embodiments, the dielectric layer 102 can include a semiconductor oxide. For example, the dielectric layer 102 may include a silicon oxide ($SiO_x$) layer, such as a silicon dioxide ($SiO_2$) layer, but the disclosure is not limited thereto.

Referring to FIG. 3, in operations 11 and 21, a semiconductor layer 104 is formed over the substrate 100. In some embodiments, the semiconductor layer 104 is formed over the dielectric layer 102, but the disclosure is not limited thereto. The semiconductor layer 104 may include a first semiconductor material, for example but not limited thereto, silicon. In some embodiments, a thickness of the semiconductor layer (i.e., the silicon layer) 104 is between approximately 20 nanometers and approximately 100 nanometers, but the disclosure is not limited thereto.

Figure 4:
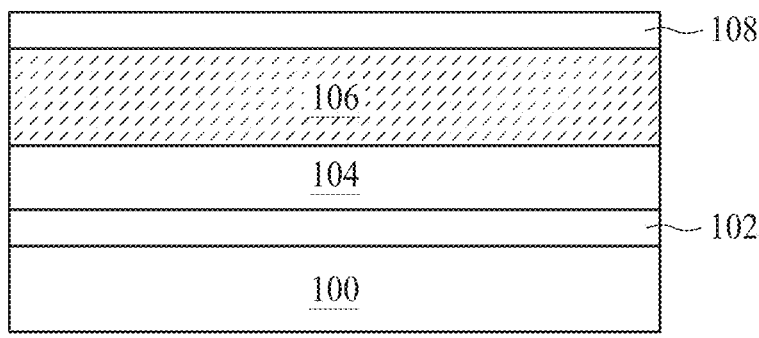

Referring to FIG. 4, in operations 12 and operation 21, another semiconductor layer 106 is formed on the semiconductor layer 104. The semiconductor layer 106 includes a second semiconductor material that is different from the first semiconductor material. In some embodiments, a lattice constant of the second semiconductor material is greater than a lattice constant of the first semiconductor material. For example, the first semiconductor material is silicon, and the second semiconductor material is germanium.

In some embodiments, the germanium layer 106 is formed by sputtering or chemical vapor deposition. In such embodiments, an amorphous germanium layer 106 is formed on the silicon layer 104. In other embodiments, the germanium layer 106 may be formed using an EPI operation, but the disclosure is not limited thereto. In some embodiments, a thickness of the germanium layer 106 is between approximately 20 nanometers and approximately 100 nanometers, but the disclosure is not limited thereto.

In some embodiments, a barrier layer 108 is formed on the germanium layer 106. The barrier layer 108 may include materials different from those of the semiconductor layers 104 and 106. In some embodiments, the barrier layer 108 includes insulating materials such as silicon nitride or silicon oxide, but the disclosure is not limited thereto. In some embodiments, when the barrier layer 108 includes the silicon nitride, a stress may be provided from the barrier layer 108 to the underlying germanium layer 106. In other embodiments, the barrier layer 108 may include conductive material, but the disclosure is not limited thereto. In some embodiments, a thickness of the barrier layer 108 is greater than 10 nanometers, but the disclosure is not limited thereto.

Figure 5:
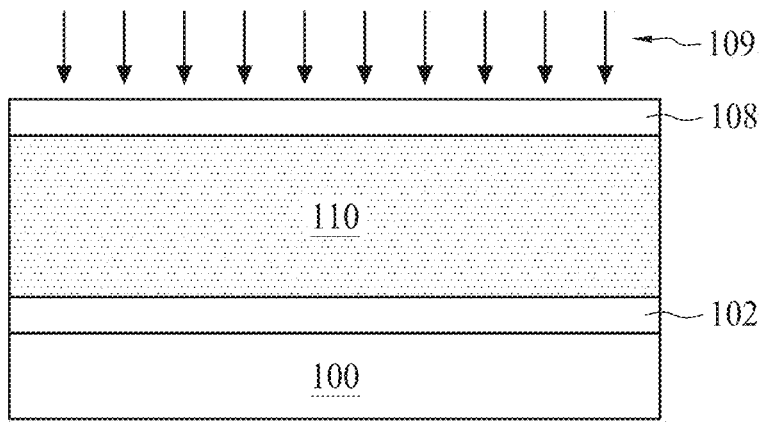

Referring to FIG. 5, in operation 13 and operation 22, the substrate 100 is annealed. In some embodiments, layers such as the silicon layer 104, the amorphous germanium layer 106 and the barrier layer 108 over the substrate 100 are annealed. In such embodiments, another semiconductor layer 110 is formed. In some embodiments, the silicon layer 104 and the amorphous germanium layer 106 are transformed to form a single crystalline silicon germanium layer 110.

In some embodiments, an anneal 109 is performed by a rapid thermal annealing (RTA). In other embodiments, the anneal 109 is performed in a furnace, but the disclosure is not limited thereto. During the anneal 109, germanium atoms diffuse from the semiconductor layer 106 downwardly into the semiconductor layer 104. Further, the germanium atoms bond with silicon atoms in the semiconductor layer 104. At the same time, the amorphous germanium layer 106 and the silicon layer 104 are re-crystalized to form a single crystalline layer. Accordingly, the two semiconductor layers 104 and 106 are transformed to form the semiconductor layer 110, wherein the semiconductor layer 110 is a single crystalline strain-relaxed silicon germanium layer 110. Further, a germanium concentration of the silicon germanium layer 110 has a positive correlation with a ratio of a thickness of the germanium layer 106 and a thickness of the silicon layer 104. In other words, a thicker germanium layer 106 helps the silicon geranium layer 110 obtain a greater germanium concentration. In some embodiments, the silicon germanium layer 110 may include $Si_{1-x}Ge_x$ alloy, wherein the germanium content, x, ranges from 0 to 1.

The barrier layer 108 helps prevent germanium atoms from out-diffusing. In other words, the barrier layer 108 helps prevent germanium atoms from diffusing into the ambient during the anneal 109. Therefore, the thickness of the barrier layer 108 is greater than approximately 10 nanometers, as mentioned above, in order to provide sufficient prevention.

In some embodiments, a temperature of the anneal 109 is greater than approximately 850° C. In such embodiments, germanium atoms may be evenly disposed in the silicon germanium layer. Further, a thickness of the silicon germanium layer 110 is equal to a sum of the thickness of the original silicon layer 104 and the thickness of the original germanium layer 106.

In some embodiments, the temperature of the anneal 109 is less than approximately 850° C. In such embodiments, the Ge concentration is gradually decreased in a direction from the germanium layer 106 to the silicon layer 104. Accordingly, a silicon germanium layer 110 with a desired germanium concentration is formed, and a silicon germanium layer 112 with a germanium concentration less than the desired germanium concentration is simultaneously formed.

Figure 7:
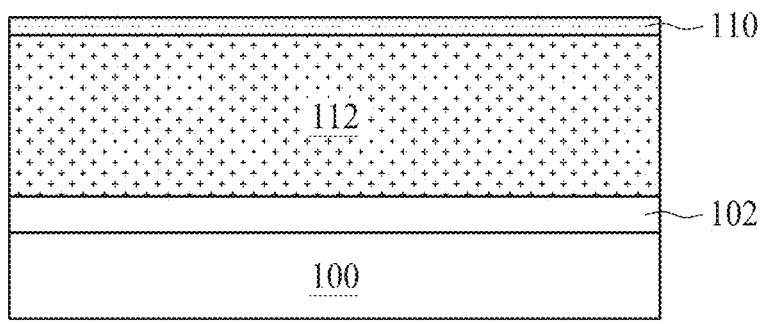
FIG. 7 is a schematic drawing illustrating a semiconductor structure according to aspects of the present disclosure in one or more embodiments.

As shown in FIG. 7, the silicon germanium layer 110 is formed over a surface of the silicon germanium layer 112. In such embodiments, the silicon germanium layer 110 serves as a shell over the silicon germanium layer 112. Further, in such embodiments, a thickness of the silicon germanium layer 110 is less than a thickness of the silicon germanium layer 112.

Figure 6:
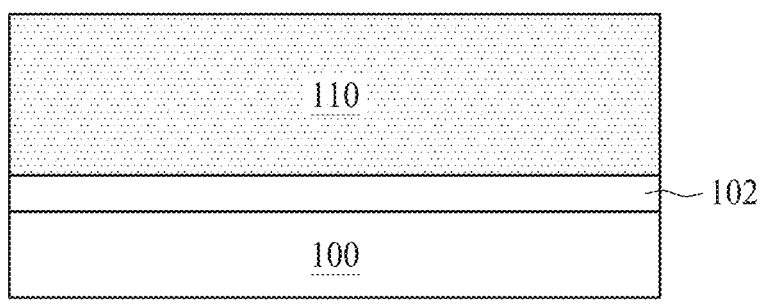

Referring to FIG. 6, in some embodiments, in operation 23, the barrier layer 108 is removed from the semiconductor layer 110 (i.e., the silicon germanium layer 110) after the annealing 109. Thus, the silicon germanium layer 110 is exposed.

According to the method of forming the semiconductor structure layer 10, the anneal 109 is performed to drive germanium atoms diffusing from the semiconductor layer (i.e., the germanium layer) 106 into the underlying semiconductor layer (i.e., the silicon layer) 104, such that a single crystalline strain-relaxed silicon germanium layer 110 is obtained. According to the method 10, the Ge concentration in the silicon germanium layer 110 has a positive correlation with the ratio of the thickness of the germanium layer 106 to a thickness of the silicon layer 104. In other words, by adjusting the thickness ratio, the germanium concentration in the silicon germanium layer 110 can be easily modified to achieve the desired concentration.

In some embodiments, the silicon germanium layer 110 may be used to form other elements in semiconductor structure. For example, the silicon germanium layer 110 may serve as a channel layer of a GAA transistor.

Figure 8A:
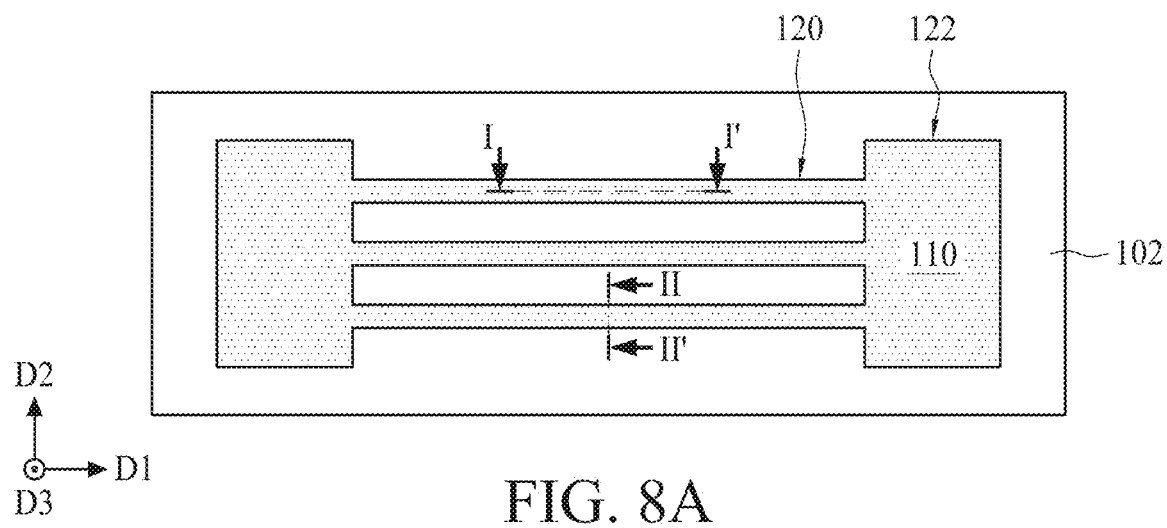
Figure 8B:
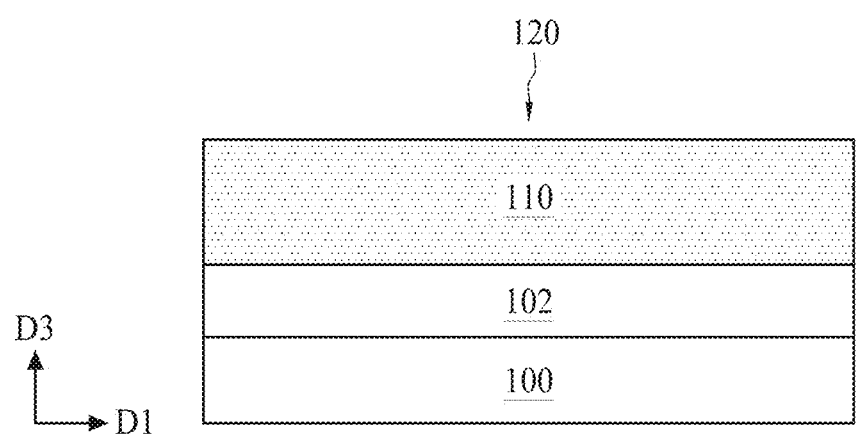
Figure 8C:
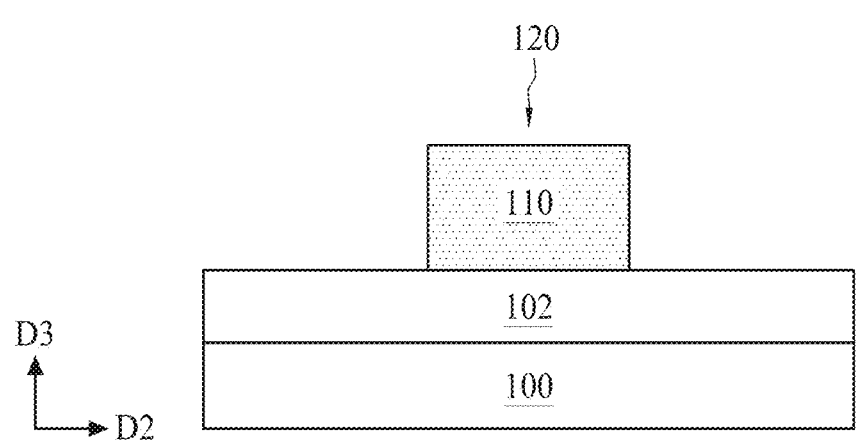

Please refer to FIGS. 8A, 8B and 8C, wherein FIG. 8B is a cross-sectional view taken along line I-I' in FIG. 8A, and FIG. 8C is a cross-sectional view taken along line II-II' in FIG. 8A. In operation 24, the silicon germanium layer 110 is patterned to form a plurality of nanowires 120. In some embodiments, operation 24 may be omitted, and the barrier layer 108 may remain on the silicon germanium layer 110 and serve as a hard mask layer, though not shown. In such embodiments, the barrier layer 108 may be removed after the forming of the nanowires.

The nanowires 120 extend in a first direction D1. Further, the nanowires 120 are arranged in a second direction D2 and thus are parallel to each other, as shown in FIG. 8A. In some embodiments, the first direction D1 and the second direction D2 are different directions but are in a same plane. The nanowires 120 protrude in a third direction D3 that is perpendicular to both the first and second directions D1 and D2, as shown in FIG. 8C. In some embodiments, the nanowires 120 are referred to as horizontal nanowires. In some embodiments, anchors 122 are formed simultaneously with the forming of the nanowires 120. As shown in FIG. 8A, the anchors 122 are formed at two opposite ends of each nanowire 120. In other words, each nanowire 120 is coupled to an anchor 122 at each of two ends. In some embodiments, a diameter of each nanowire 120 may be less than 20 nanometers, but the disclosure is not limited thereto.

Figure 9A:
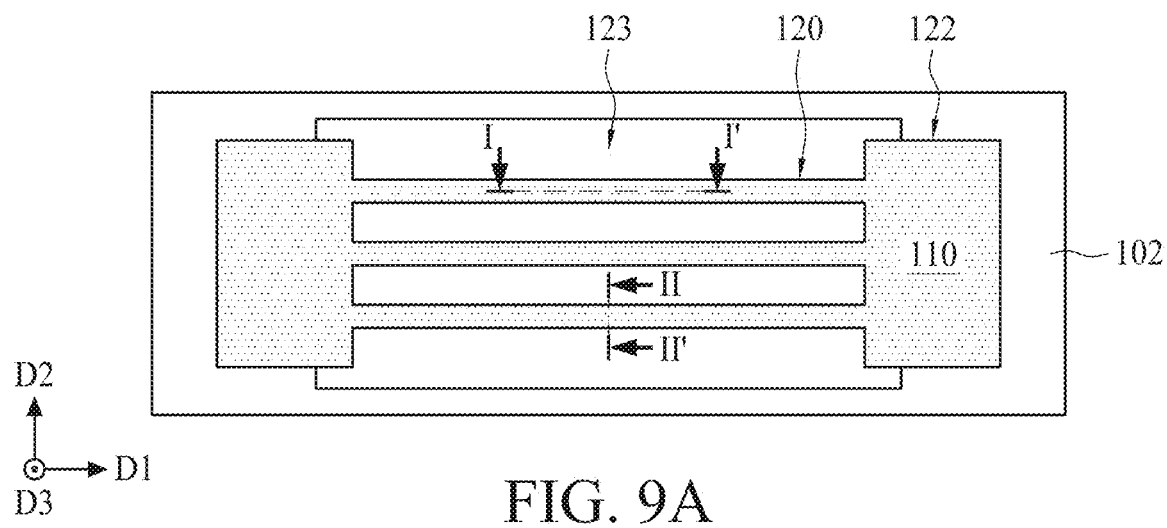
Figure 9B:
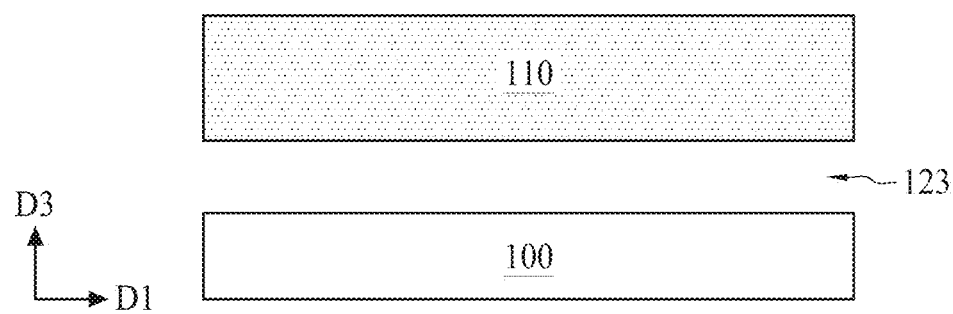
Figure 9C:
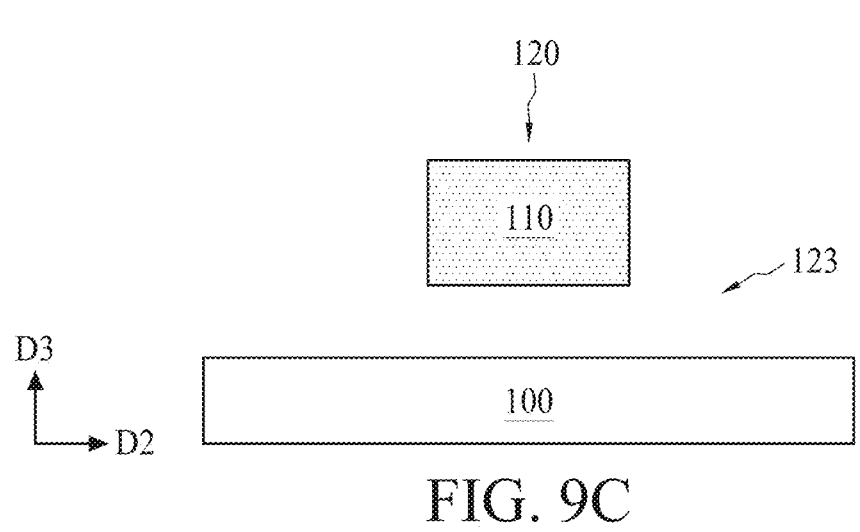

Please refer to FIGS. 9A to 9C, wherein FIG. 9A is a drawing illustrating a stage subsequent to FIG. 8A, FIG. 9B is a cross-sectional view taken along line I-I' in FIG. 9A, and FIG. 9C is a cross-sectional view taken along line II-II' in FIG. 9A. In operation 25, a portion of the dielectric layer 102 under the nanowires 120 is removed to form a trench 123. Consequently, the nanowires 120 are suspended over the trench 123, as shown in FIGS. 9B and 9C.

Figure 10A:
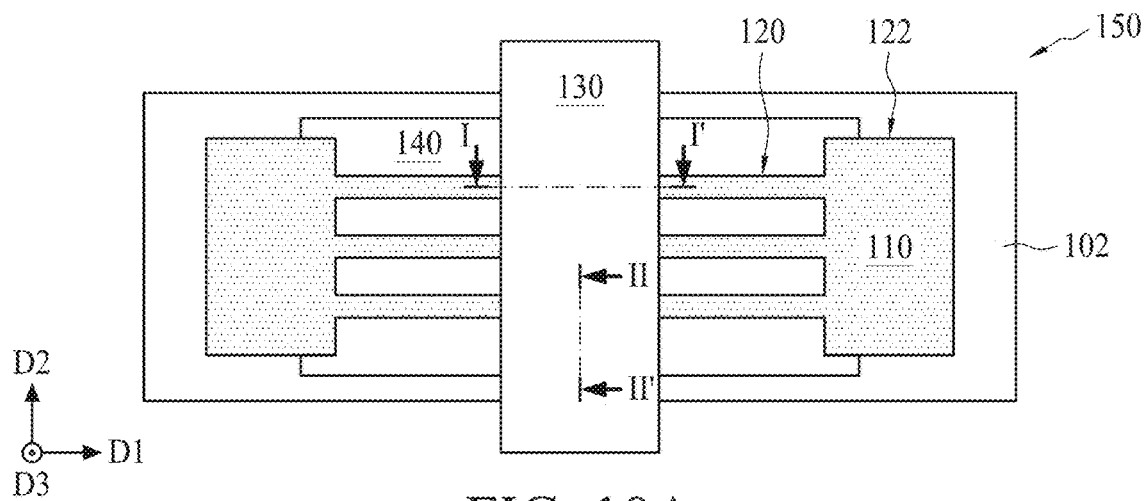
Figure 10B:
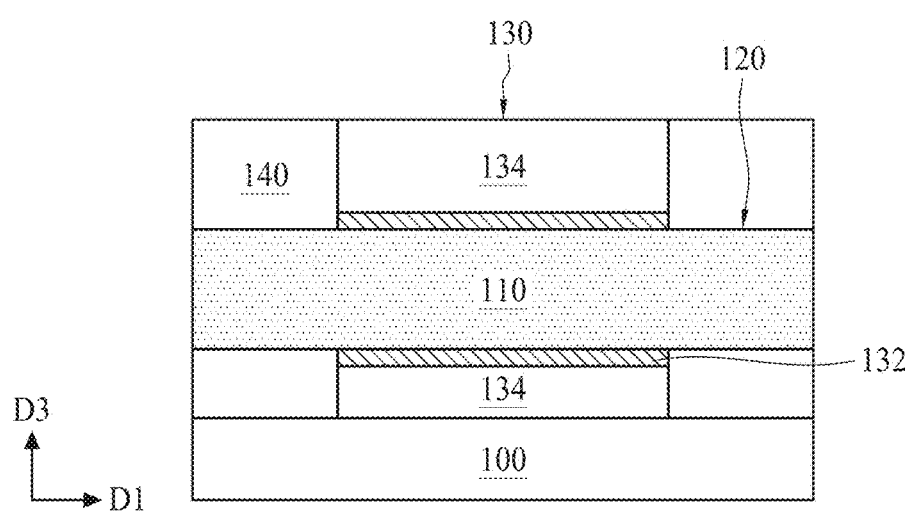
Figure 10C:
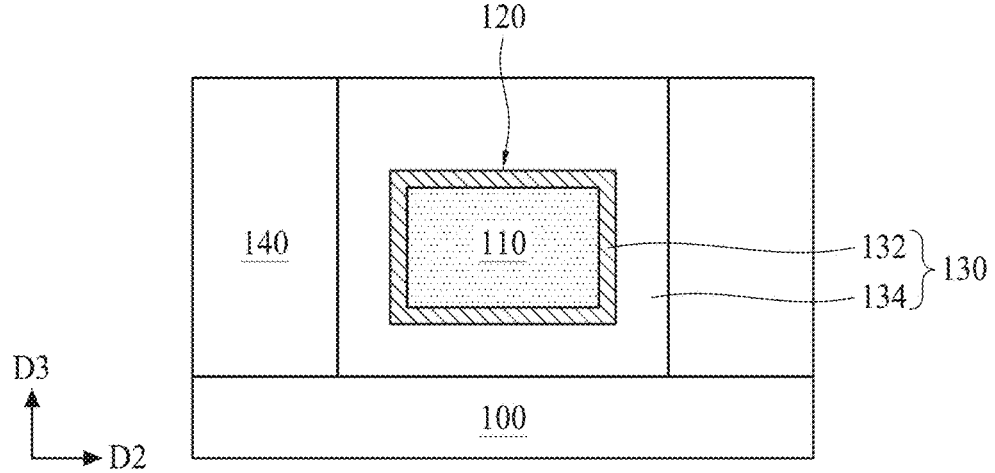

Please refer to FIGS. 10A to 10C, wherein FIG. 10A is a drawing illustrating a stage subsequent to FIG. 9A, FIG. 10B is a cross-sectional view taken along line I-I' in FIG. 10A, and FIG. 10C is a cross-sectional view taken along line II-II' in FIG. 10A. In operation 26, a gate structure 130 is formed to surround the nanowires 120. In some embodiments, the gate structure 130 may be formed to surround a portion of each nanowire 120. Additionally, other portions of the nanowire 120 may be exposed through the gate structure 130.

The gate structure 130 may include a high-k gate dielectric layer 132 and a metal gate electrode layer 134. In some embodiments, an interfacial layer (IL) (not shown) may be formed between the high-k gate dielectric layer 132 and the nanowire 120. The gate structure 130 may be formed using an RPG approach. In such embodiments, a sacrificial gate (not shown) may be formed to surround the nanowire. Further, source/drain extensions and source/drain structures can be formed after the forming of the sacrificial gate, though not shown. In some embodiments, the source/drain structures can be a strained source/drain structure.

In some embodiments, a dielectric structure 140 is formed over the substrate 100. In some embodiments, the dielectric structure 140 can include an etch-stop layer (e.g., a contact etch stop layer (CESL) (not shown) and various dielectric layers (e.g., an inter-layer dielectric (ILD) layer) formed over the substrate 100 after the forming of the strained source/drain structures. In some embodiments, the CESL includes a SiN layer, a SiCN layer, a SiON layer, and/or other materials known in the art. In some embodiments, the ILD layer includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. Accordingly, the nanowires 120, the anchors 122, the sacrificial gate and the source/drain structures are embedded in the dielectric structure 140.

In some embodiments, the sacrificial gate is removed to form a gate trench (not shown). In such embodiments, the nanowires 120 may be exposed through the gate trench. Subsequently, the high-k gate dielectric layer 132 is formed to surround each nanowire 120 exposed through the gate trench. In some embodiments, the high-k gate dielectric layer 132 may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride (HfOxNy), other suitable metal-oxides, or combinations thereof. As mentioned above, an IL may be formed prior to the forming of the high-k gate dielectric layer 132.

The metal gate electrode layer 134 is formed over the high-k gate dielectric layer 132. In some embodiments, the metal gate electrode layer 134 may include at least a barrier metal layer, a work functional metal layer and a gap-filling metal layer. The barrier metal layer can include, for example but not limited thereto, TiN. The work function metal layer can include a single layer of TiN, TaN, TaAlC, TiC, TaC, Co, Al, TiAl, HfTi, TiSi, TaSi or TiAlC, or a multilayer of two or more of these materials, but is not limited thereto. For a p-channel FET, one or more of TiAlC, Al, TiAl, TaN, TaAlC, TIN, TiC and Co are used as the work function metal layer. In some embodiments, the gap-filling metal layer can include conductive material such as Al, Cu, AlCu, or W, but the material is not limited thereto.

Accordingly, a GAA transistor 150 is obtained, as shown in FIGS. 10A to 10C. The transistor 150 has the single crystalline strain-relaxed silicon germanium layer 110 serving as the channel layer.

Figure 11:
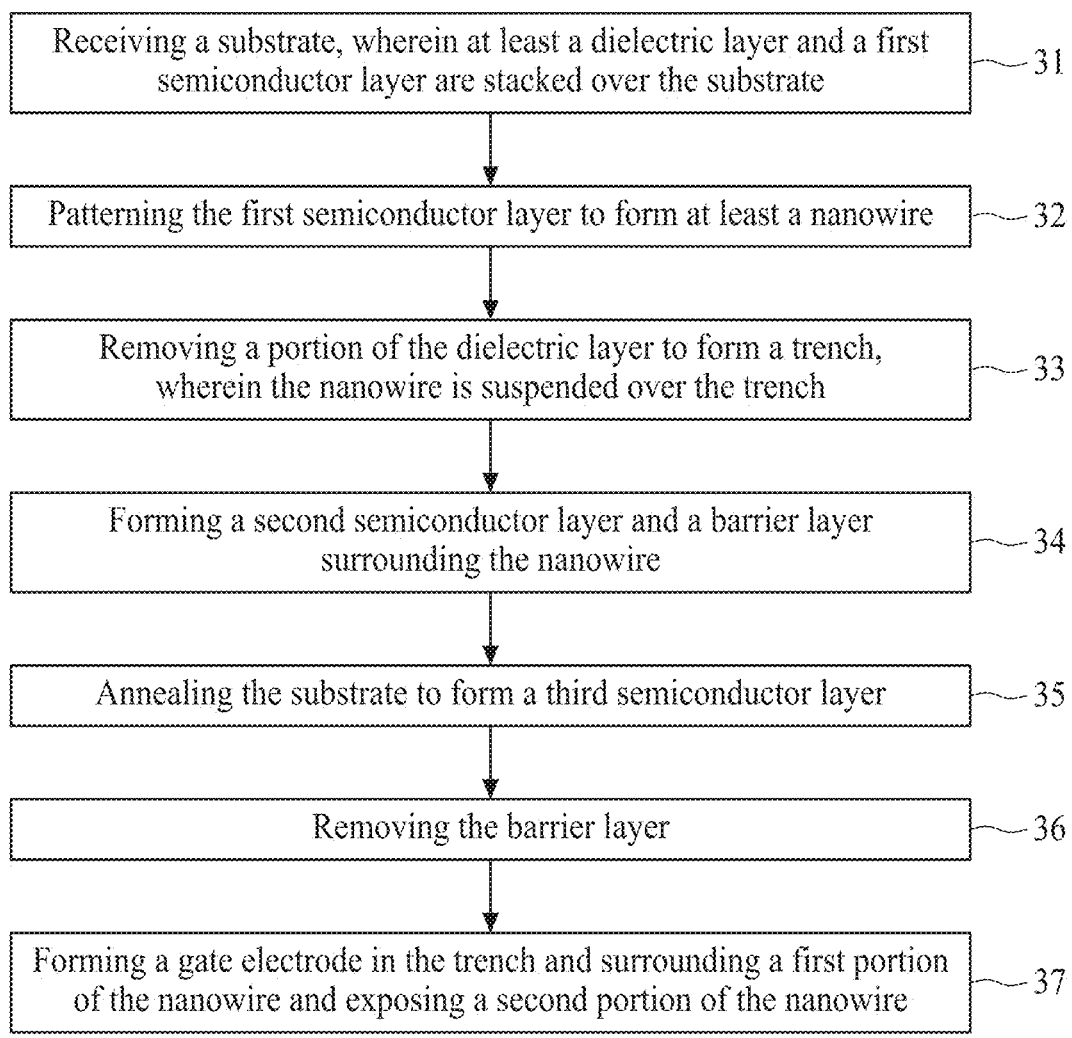
FIG. 11 is a flow diagram of some embodiments of a method of forming a semiconductor structure.

FIG. 11 is a flow diagram of some embodiments of a method of forming a semiconductor structure 30, and FIGS.

12A to 18C are schematic drawings illustrating the method of forming the semiconductor structure at various fabrication stages. The method 30 includes a number of operations (31, 32, 33, 34, 35, 36 and 37). The method 30 will be further described according to one or more embodiments. It should be noted that the operations of the method 30 may be rearranged or otherwise modified within the scope of the various aspects. It should be further noted that additional processes may be provided before, during, and after the method 30, and that some other processes may be only briefly described herein. Thus, other implementations are possible within the scope of the various aspects described herein.

Figure 12A:
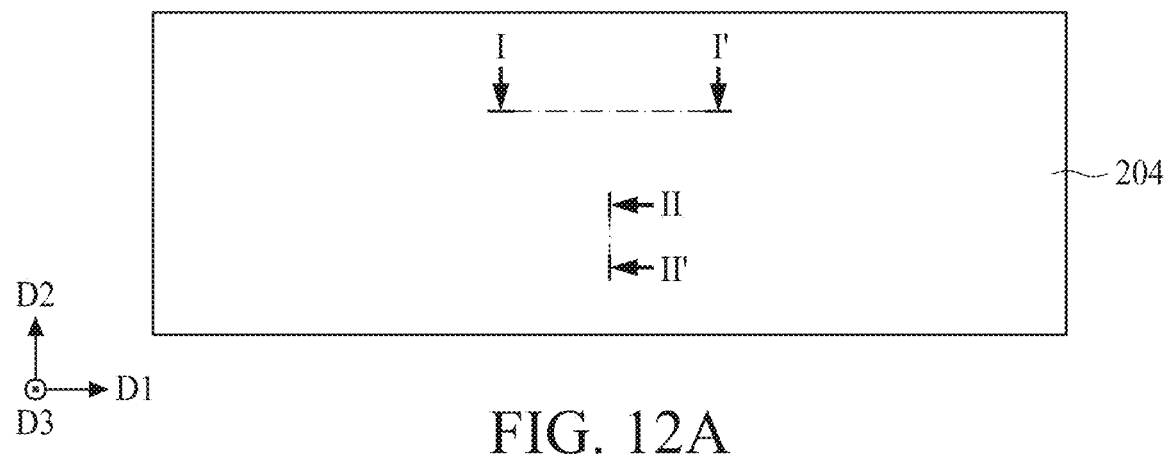
Figure 12B:
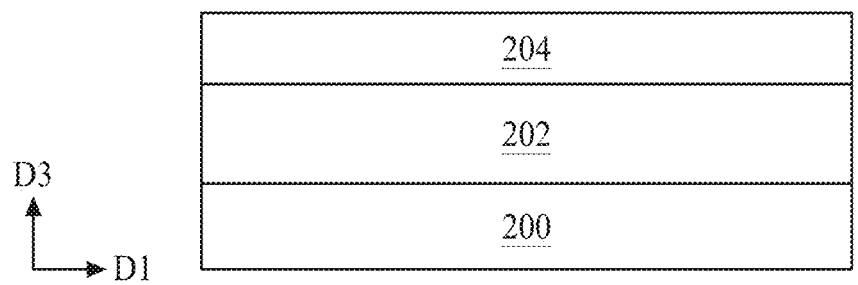
Figure 12C:
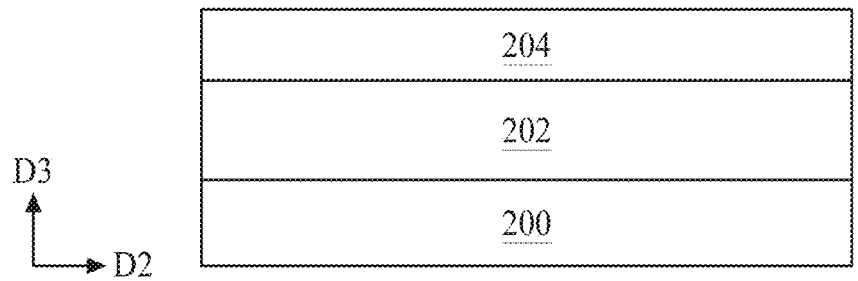

Please refer to FIGS. 12A, 12B and 12C, wherein FIG. 12B is a cross-sectional view taken along line I-I' in FIG. 12A, and FIG. 12C is a cross-sectional view taken along line II-II' in FIG. 12A. In operation 31, a substrate 200 is received. Further, a dielectric layer 202 and a semiconductor layer 204 are stacked over the substrate 200. The substrate 200 may include a material that is same as the material of the substrate 100, the dielectric layer 202 may include a material and parameters that are same as those of the dielectric layer 102, and the semiconductor layer 204 may include a material and parameters that are same as those of the semiconductor layer 104; therefore, repeated descriptions are omitted for brevity. For example, the semiconductor layer 204 is a silicon layer, but the disclosure is not limited thereto.

Figure 13A:
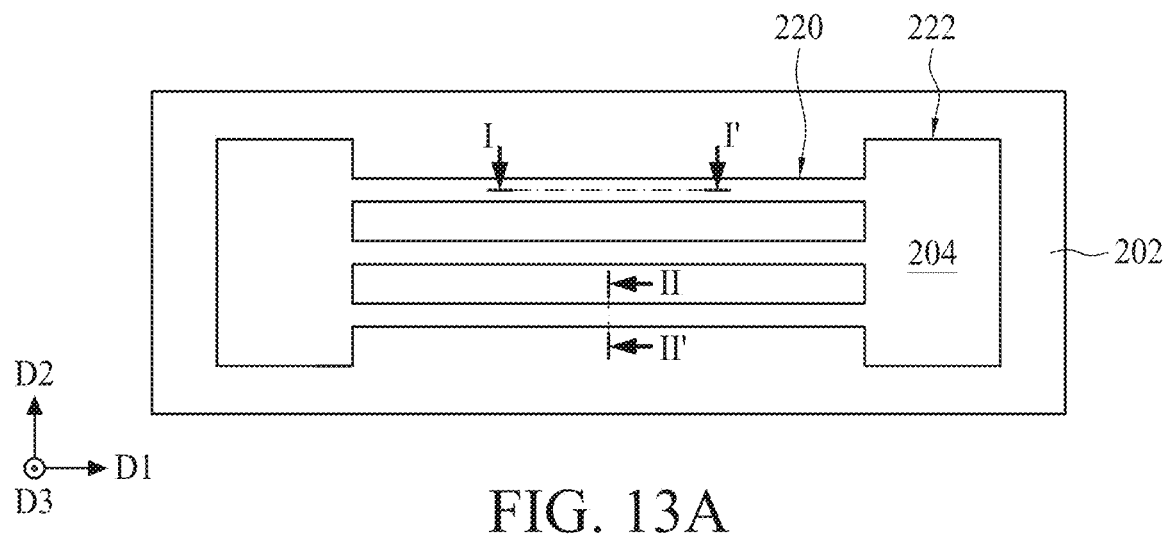
Figure 13B:
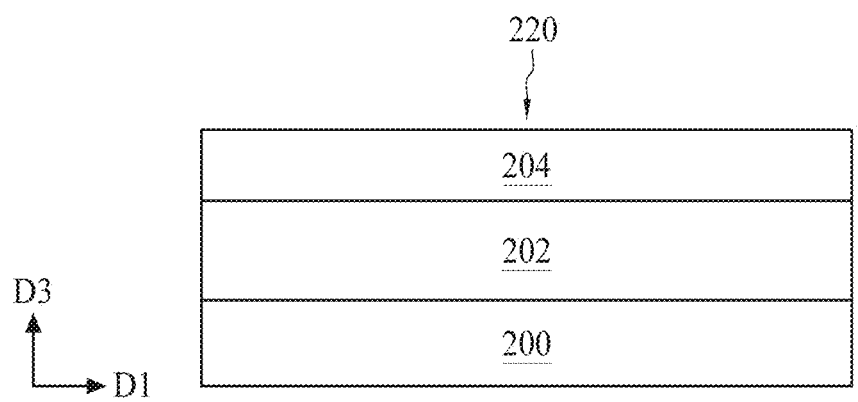
Figure 13C:
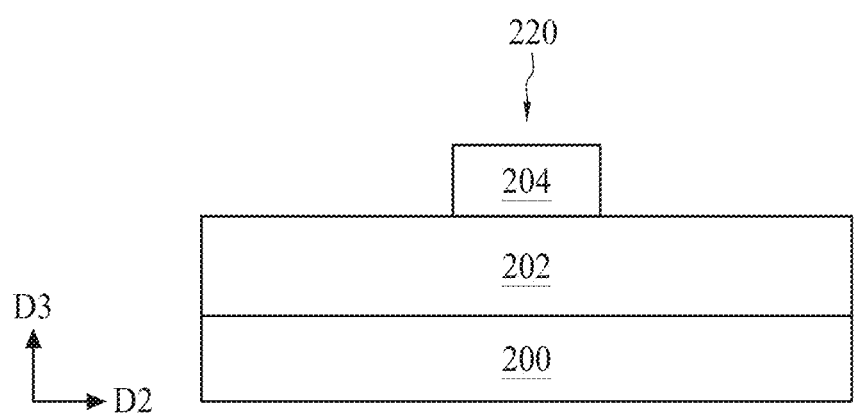

Please refer to FIGS. 13A, 13B and 13C, wherein FIG. 13A is a drawing illustrating a stage subsequent to FIG. 12A, FIG. 13B is a cross-sectional view taken along line I-I' in FIG. 13A, and FIG. 13C is a cross-sectional view taken along line II-II' in FIG. 13A. In operation 32, the silicon layer 204 is patterned to form a plurality of nanowires 220. The nanowires 220 extend in a first direction D1. Further, the nanowires 220 are arranged in a second direction D2 and thus are parallel to each other, as shown in FIG. 13A. In some embodiments, the first direction D1 and the second direction D2 are different directions but are in a same plane. The nanowires 220 protrude in a third direction D3 that is perpendicular to both the first and second directions D1 and D2, as shown in FIG. 13C. In some embodiments, the nanowires 220 are referred to as horizontal nanowires. In some embodiments, anchors 222 are formed simultaneously with the forming of the nanowires 220. As shown in FIG. 13A, the anchors 222 are formed at two opposite ends of each nanowire 220. In other words, each nanowire 220 is coupled to an anchor 222 at each of two ends.

Figure 14A:
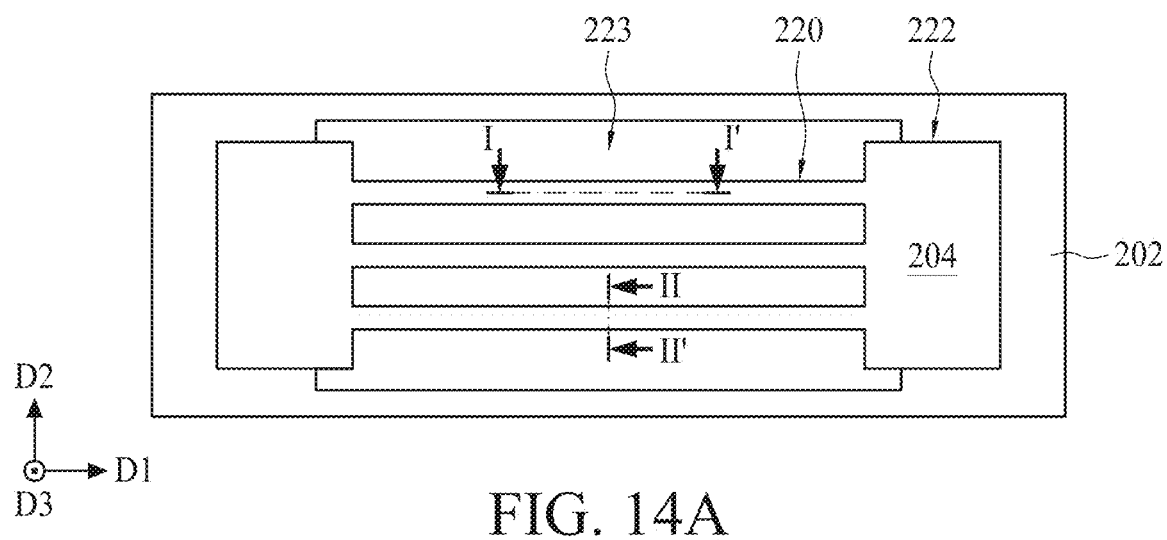
Figure 14B:
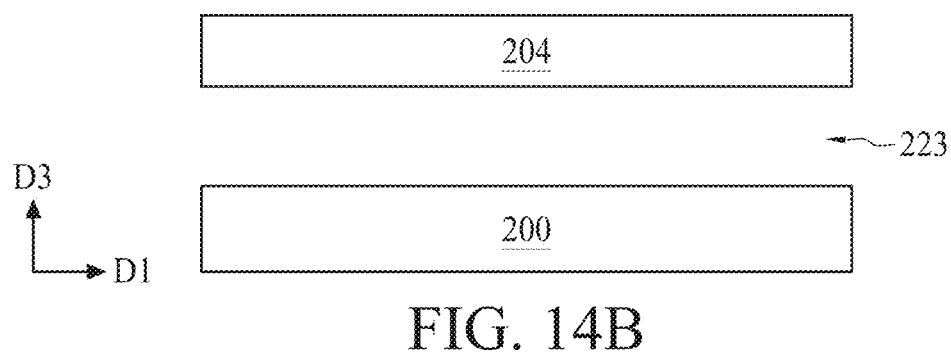
Figure 14C:
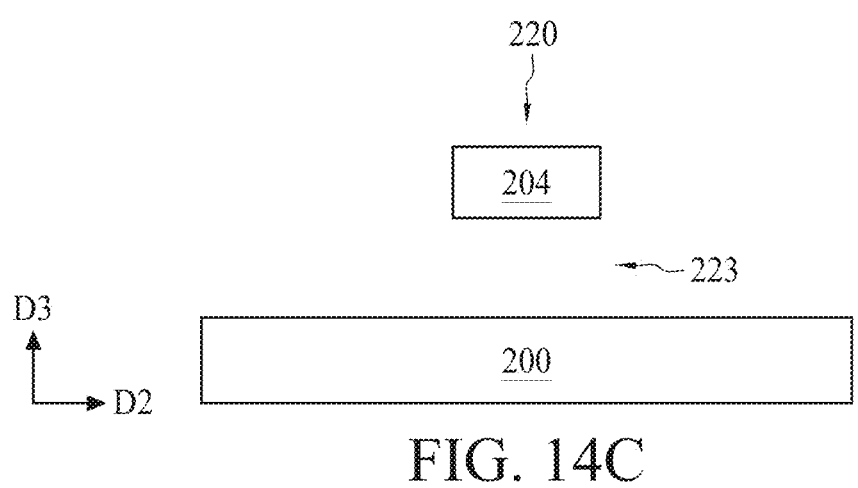

Please refer to FIGS. 14A to 14C, wherein FIG. 14A is a drawing illustrating a stage subsequent to FIG. 13A, FIG. 14B is a cross-sectional view taken along line I-I' in FIG. 14A, and FIG. 14C is a cross-sectional view taken along line II-II' in FIG. 14A. In operation 33, a portion of the dielectric layer 202 under the nanowires 220 is removed to form a trench 223. Consequently, the nanowires 220 are suspended over the trench 223, as shown in FIGS. 14B and 14C.

Figure 15A:
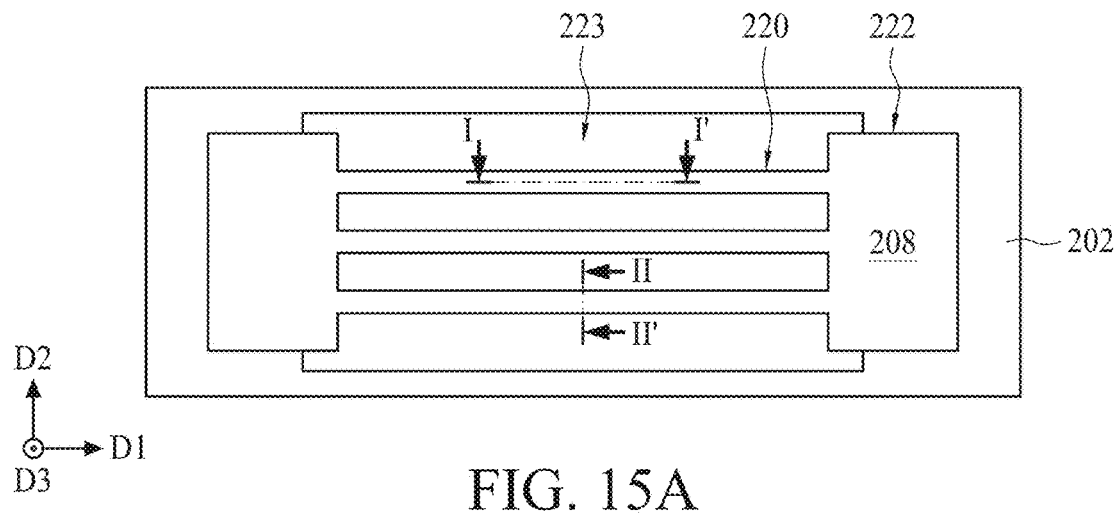
Figure 15B:
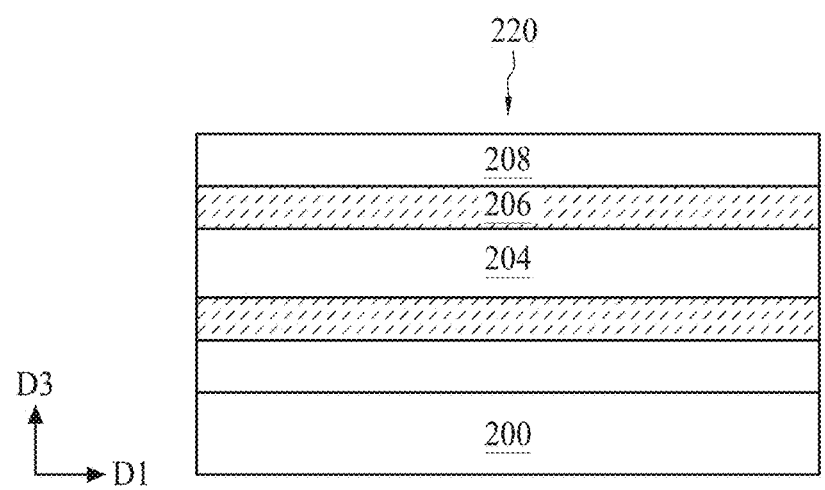
Figure 15C:
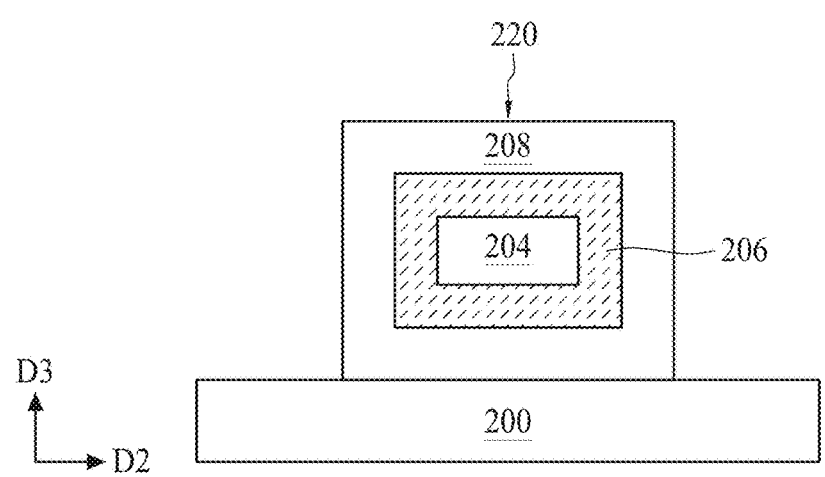

Please refer to FIGS. 15A to 15C, wherein FIG. 15A is a drawing illustrating a stage subsequent to FIG. 14A, FIG. 15B is a cross-sectional view taken along line I-I' in FIG. 15A, and FIG. 15C is a cross-sectional view taken along line II-II' in FIG. 15A. In operation 34, another semiconductor layer 206 and a barrier layer 208 are formed to surround each of the nanowires 220. In some embodiments, the semiconductor layer 206 may include a material and parameters that are same as those of the semiconductor layer 106, and the barrier layer 208 may include a material and parameters that are same as those of the barrier layer 108; therefore, repeated descriptions are omitted for brevity. For example, the semiconductor layer 206 is an amorphous germanium layer, but the disclosure is not limited thereto.

Figure 16A:
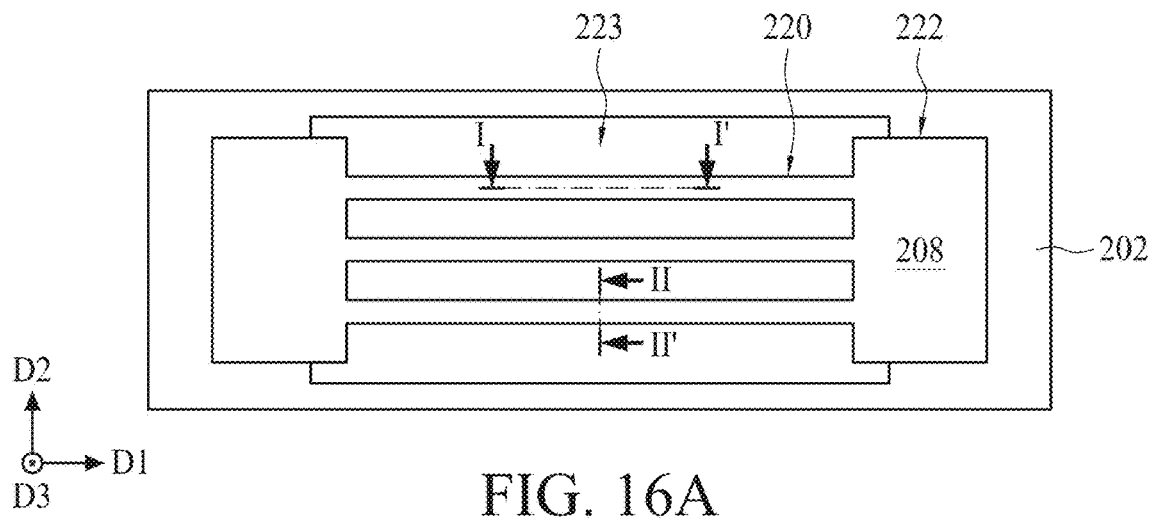
Figure 16B:
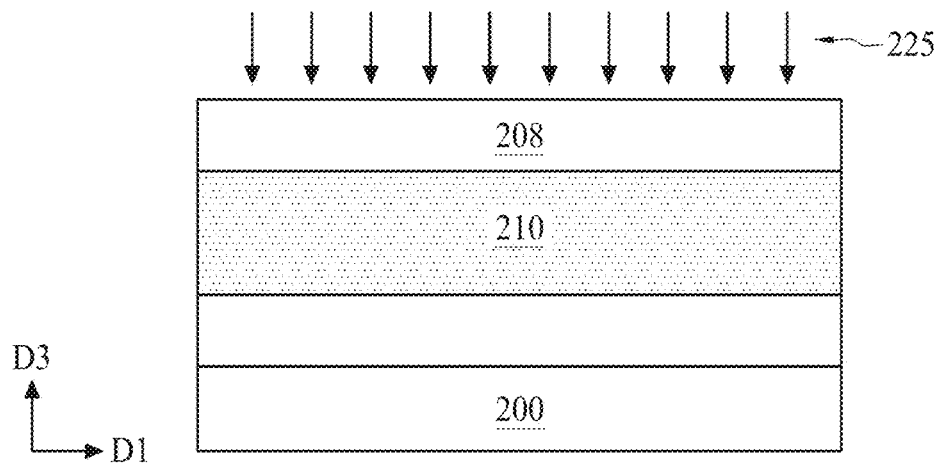
Figure 16C:
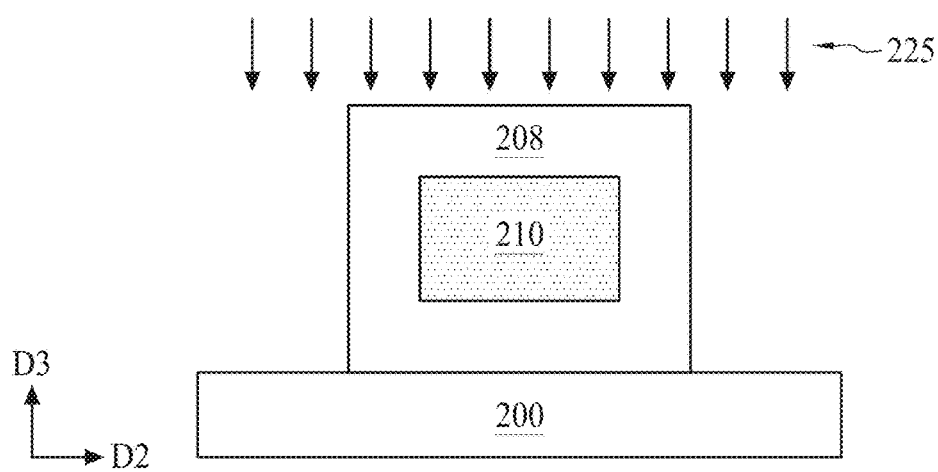

Please refer to FIGS. 16A to 16C, wherein FIG. 16A is a drawing illustrating a stage subsequent to FIG. 15A, FIG. 16B is a cross-sectional view taken along line I-I' in FIG. 16A, and FIG. 16C is a cross-sectional view taken along line II-II' in FIG. 16A. In operation 35, an anneal 225 is performed. In some embodiments, layers such as the silicon layer 204, the amorphous germanium layer 206 and the barrier layer 208 over the substrate 200 are annealed such that the silicon layer 204 and the amorphous germanium layer 206 are transformed to form a crystal silicon germanium layer 210, as shown in FIGS. 16B and 16C. In some embodiments, the anneal 225 is performed by a rapid thermal annealing (RTA). In other embodiments, the anneal 225 is performed in a furnace, but the disclosure is not limited thereto.

During the anneal 225, germanium atoms diffuse from the semiconductor layer 206 and downwardly into the semiconductor layer 204. Further, the germanium atoms and bond with silicon atoms in the semiconductor layer 204. At the same time, the amorphous germanium layer 206 and the silicon layer 204 are re-crystalized to form a single crystal layer. Accordingly, the two semiconductor layers (i.e., the silicon layer 204 and the germanium layer 206) are transformed to form one semiconductor layer 210, wherein the semiconductor layer 210 is a single crystal strain-relaxed silicon germanium layer. Further, a germanium concentration of the silicon germanium layer 210 has a positive correlation with a ratio of a thickness of the germanium layer 206 to a thickness of the silicon layer 208.

As mentioned above, the barrier layer 208 helps prevent germanium atoms from out-diffusing. In other words, the barrier layer 208 helps prevent germanium atoms from diffusing into the ambient during the anneal 225. Therefore, the thickness of the barrier layer 208 is greater than approximately 10 nanometers, as mentioned above, in order to provide sufficient prevention.

In some embodiments, a temperature of the anneal 225 is greater than approximately 850° C. In such embodiments, germanium atoms may be evenly disposed in the silicon germanium layer. Further, a thickness of the silicon germanium layer 210 is equal to a sum of a thickness of the original silicon layer 204 and the thickness of the original germanium layer 206.

Figure 17A:
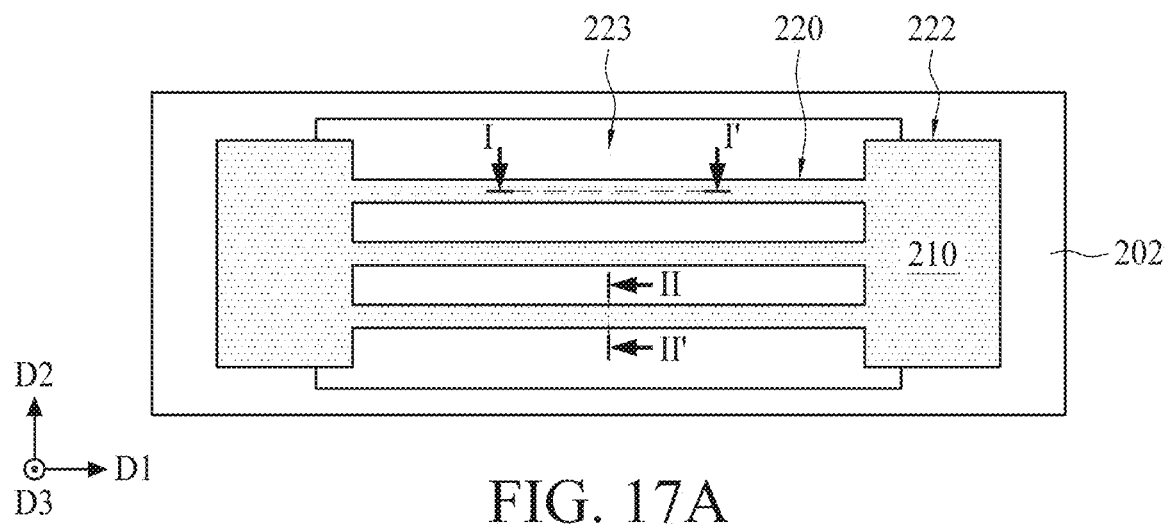
Figure 17B:
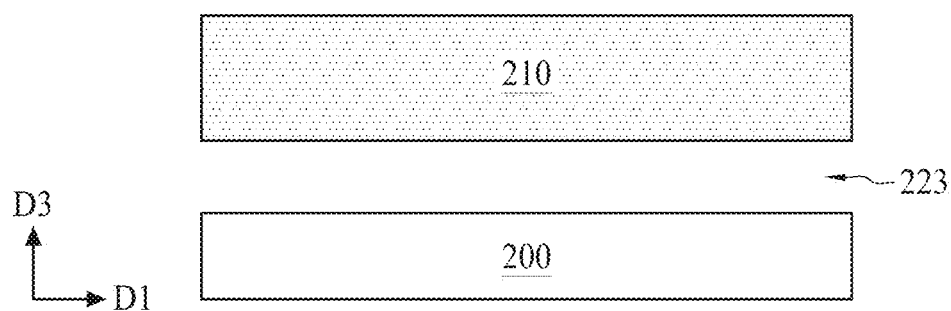
Figure 17C:
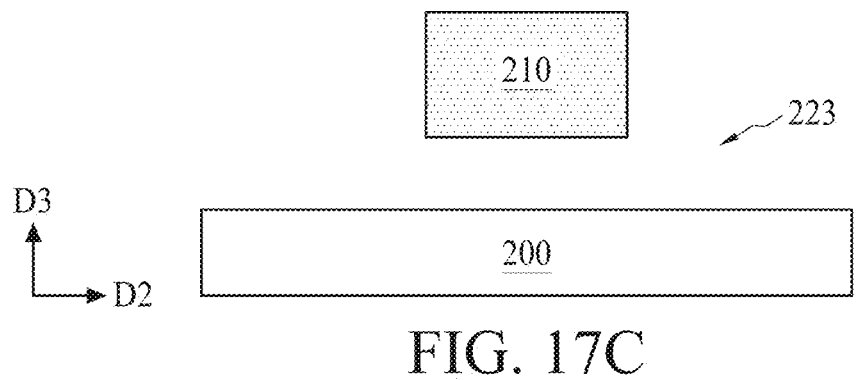

Please refer to FIGS. 17A to 17C, wherein FIG. 17A is a drawing illustrating a stage subsequent to FIG. 16A, FIG. 17B is a cross-sectional view taken along line I-I' in FIG. 17A, and FIG. 17C is a cross-sectional view taken along line II-II' in FIG. 17A. In operation 36, the barrier layer 208 is removed from the semiconductor layer 210 (i.e., the silicon germanium layer 210) after the annealing 225. Thus, the silicon germanium layer 210 is exposed through the trench 223.

Figure 18A:
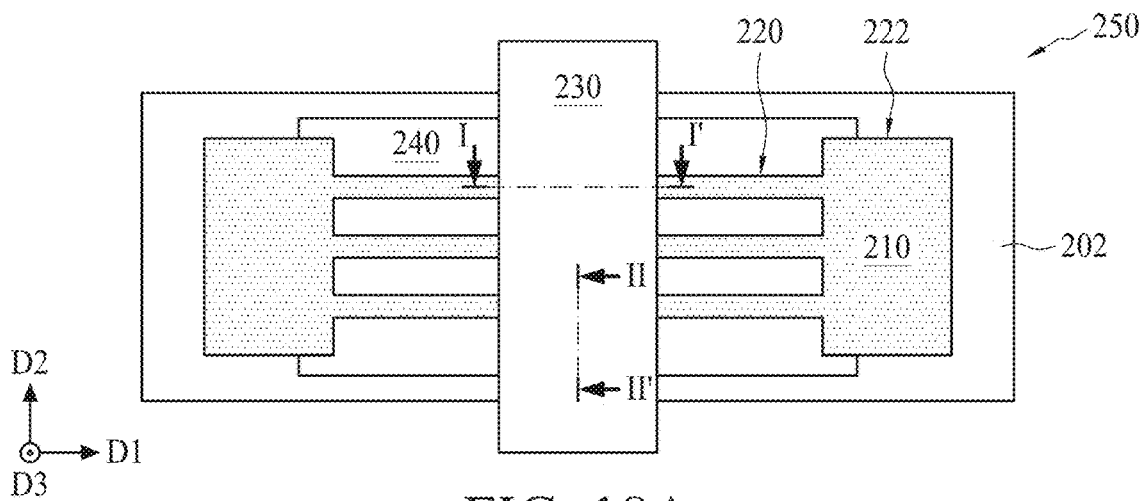
Figure 18B:
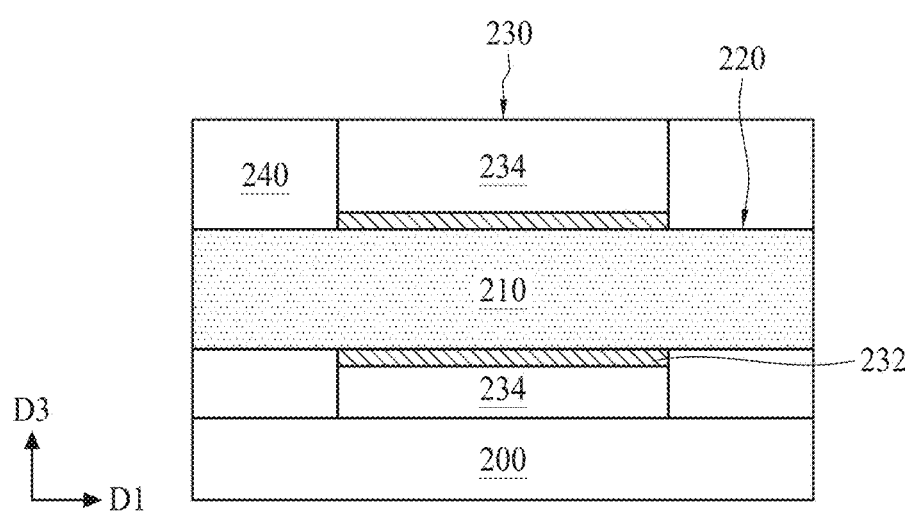
Figure 18C:
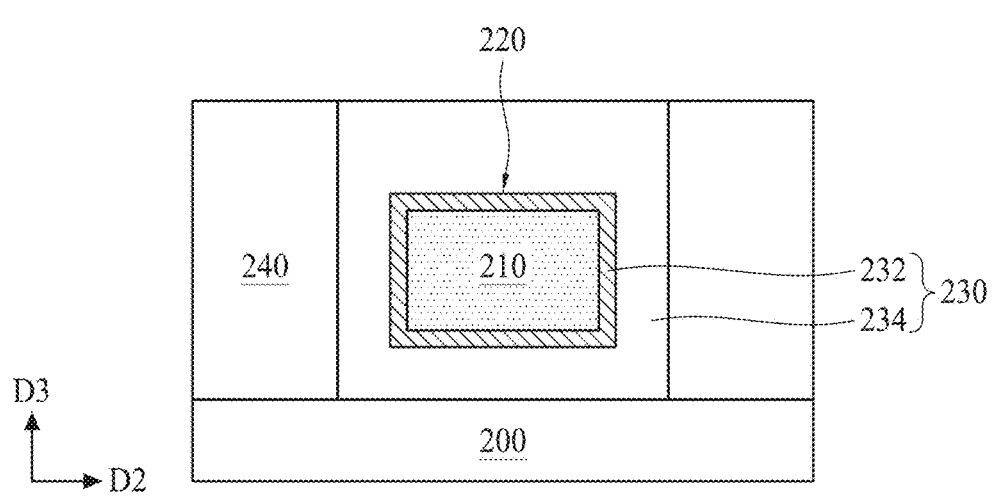

Please refer to FIGS. 18A to 18C, wherein FIG. 18A is a drawing illustrating a stage subsequent to FIG. 17A, FIG. 18B is a cross-sectional view taken along line I-I' in FIG. 18A, and FIG. 18C is a cross-sectional view taken along line II-II' in FIG. 18A. In operation 37, a gate structure 230 is formed to surround the nanowires 220. The gate structure 230 may include a high-k gate dielectric layer 232 and a metal gate electrode layer 234. In some embodiments, an interfacial layer (IL) (not shown) may be formed between the high-k gate dielectric layer 232 and the nanowire 220. In some embodiments, the gate structure 230 may be formed to surround a portion of each nanowire 220. Additionally, other portions of the nanowire 220 may be exposed through the gate structure 230. In some embodiments, operations for forming the gate structure 230 (and source/drain structure, though not shown) may be similar to those for forming the gate structure 130; therefore, repeated descriptions are omitted for brevity.

Additionally, a dielectric structure 240 may be formed over the substrate 200. Materials of the dielectric structure 240 and operations for forming the dielectric structure 240 may be similar to those for forming the dielectric structure 140; therefore, repeated descriptions are omitted for brevity. Accordingly, a GAA transistor 250 is obtained, as shown in FIGS. 18A to 18C. The transistor 250 has the single crystalline strain-relaxed silicon germanium layer 210 serving as the channel layer.

Figure 19A:
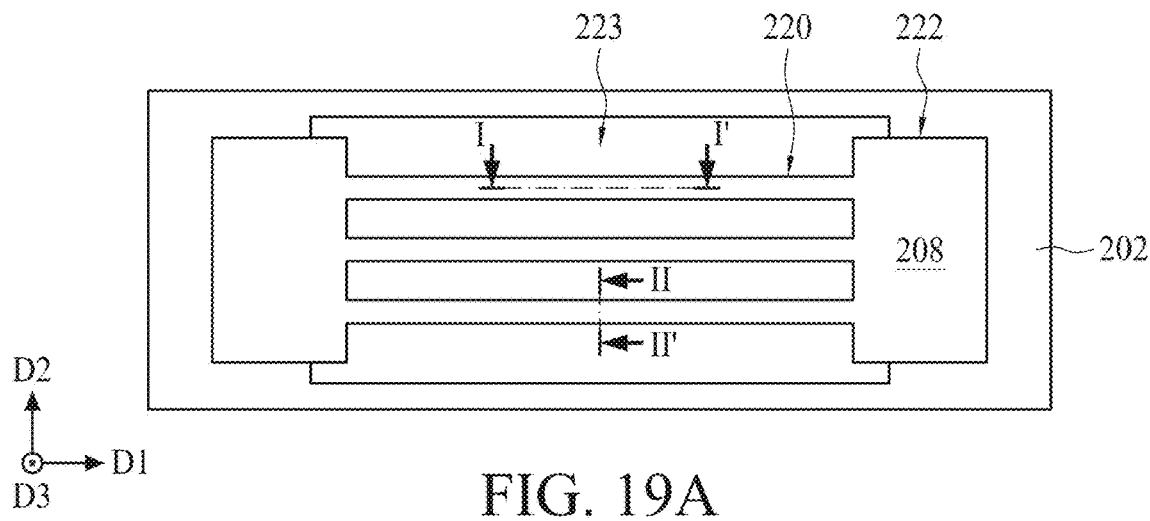

Please refer to FIGS. 19A to 21C, which are schematic drawings illustrating the method of forming the semiconductor structure at various fabrication stages. Further, FIG. 19A is a drawing illustrating a stage subsequent to FIG. 15A, FIG. 19B is a cross-sectional view taken along line I-I' in FIG. 19A, and FIG. 19C is a cross-sectional view taken along line II-II' in FIG. 19A. Further, same elements in FIGS. 12A to 18C and FIGS. 19A to 21C may have similar materials; therefore, repeated descriptions are omitted for brevity.

In some embodiments, operations 31 to 34 are performed. For example, in operation 31, a substrate 200 is received. A dielectric layer 202 and a semiconductor layer 204 are stacked over the substrate 200. As mentioned above, the semiconductor layer 204 is a silicon layer, but the disclosure is not limited thereto. In operation 32, the silicon layer 204 is patterned to form a plurality of nanowires 220. In operation 33, a portion of the dielectric layer 202 under the nanowires 220 is removed to form a trench 223. Consequently, the nanowires 220 are suspended over the trench 223. In operation 34, another semiconductor layer 206 and a barrier layer 208 are formed to surround each of the nanowires 220. As mentioned above, the semiconductor layer 206 is an amorphous germanium layer.

Figure 19B:
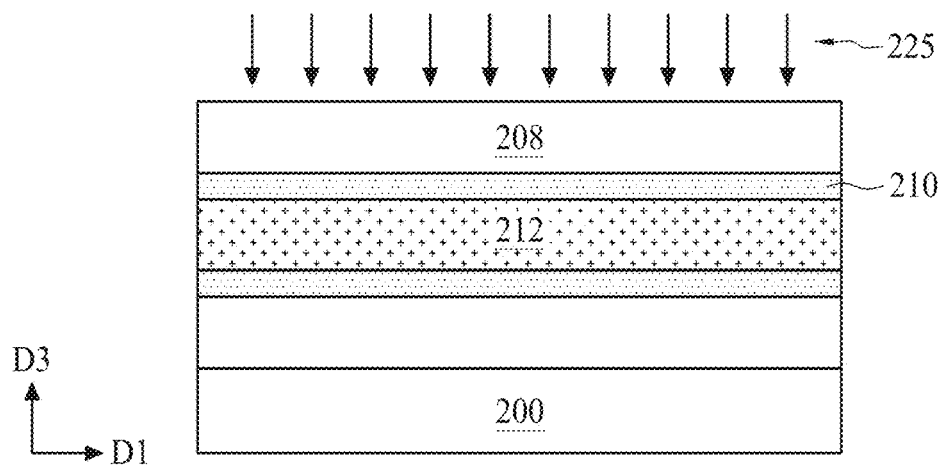
Figure 19C:
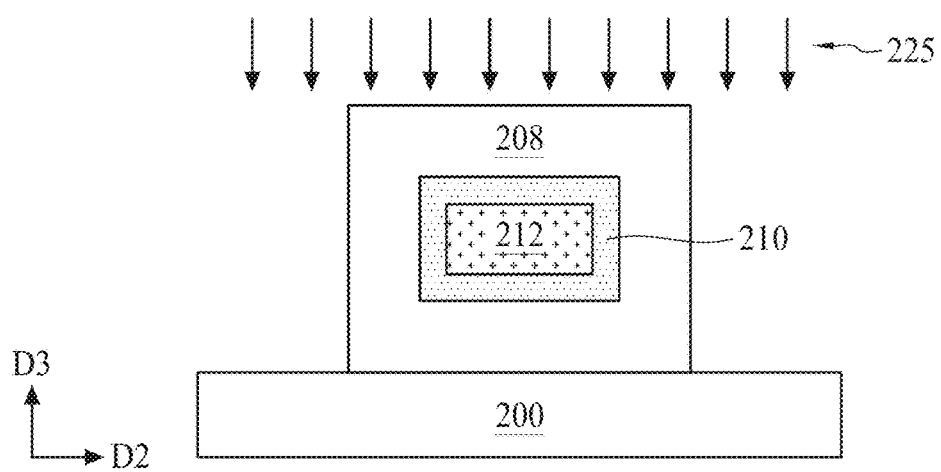

Referring to FIG. 19A to 19C, in operation 35, an anneal 225 is performed. In some embodiments, layers such as the silicon layer 204, the amorphous germanium layer 206 and the barrier layer 208 over the substrate 200 are annealed such that the silicon layer 204 and the amorphous germanium layer 206 are transformed to form a crystal silicon germanium layer 210, as shown in FIGS. 19B and 19C. In some embodiments, the anneal 225 is performed by a rapid thermal annealing (RTA). In other embodiments, the anneal 225 is performed in a furnace, but the disclosure is not limited thereto.

During the anneal 225, germanium atoms diffuse from the semiconductor layer 206 and downwardly into the semiconductor layer 204. Further, the germanium atoms and bond with silicon atoms in the semiconductor layer 204. At the same time, the amorphous germanium layer 206 and the silicon layer 204 are re-crystalized to form a single crystal layer. In some embodiments, the temperature of the anneal 225 is less than approximately 850° C. In such embodiments, the Ge concentration is gradually decreased in a direction from the germanium layer 206 to the silicon layer 204. Accordingly, a silicon germanium layer 210 with a desired germanium concentration is obtained, and a silicon germanium layer 212 with a germanium concentration less than the desired germanium concentration is simultaneously obtained. As shown in FIGS. 19B and 19C, the silicon germanium layer 210 is formed over a surface of the silicon germanium layer 212. In such embodiments, the silicon germanium layer 110 serves as a shell over the silicon germanium layer 212. Further, in such embodiments, a thickness of the silicon germanium layer 210 is less than a thickness of the silicon germanium layer 212.

Figure 20A:
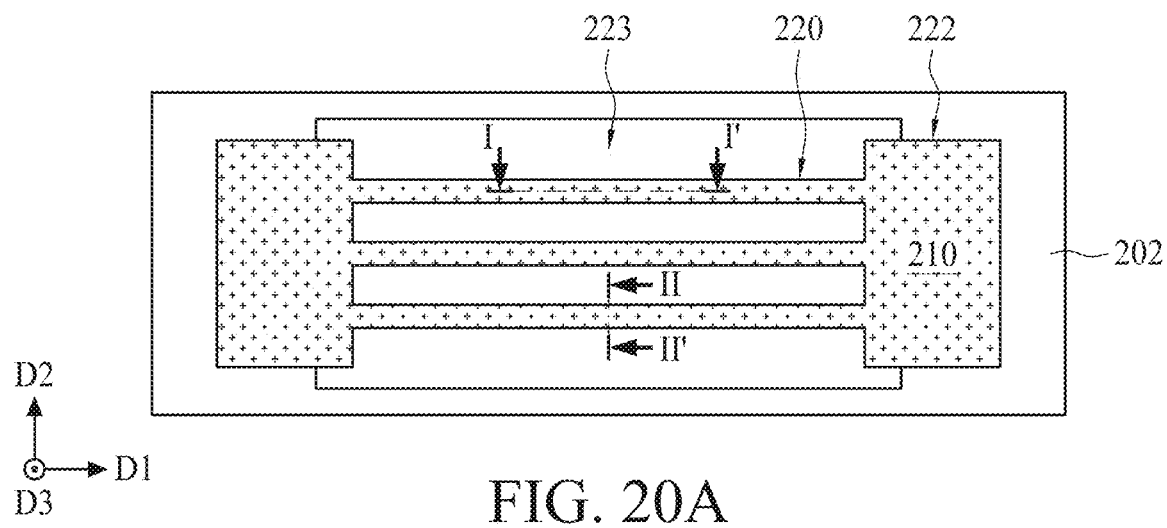
Figure 20B:
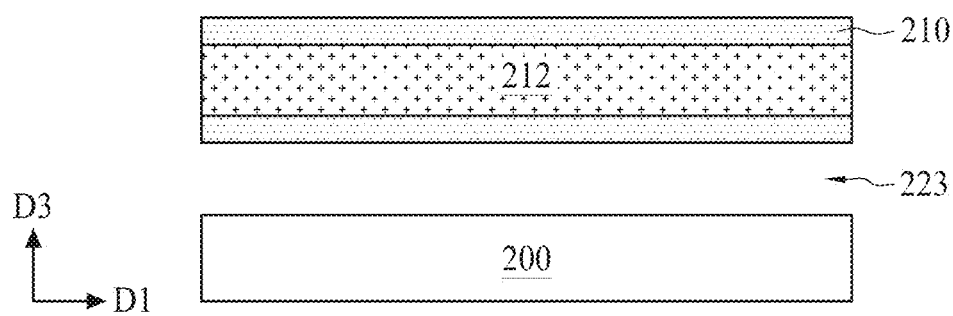
Figure 20C:
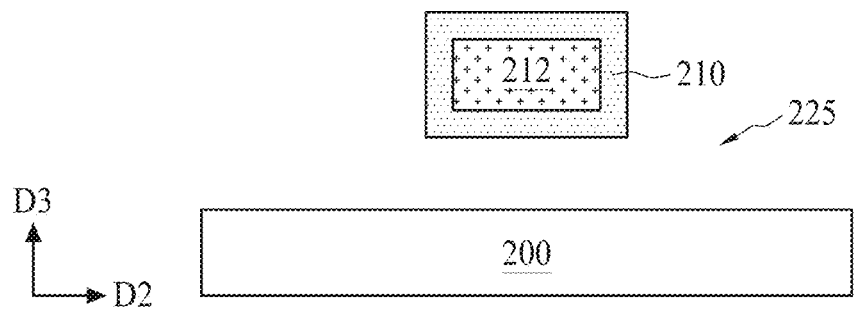

Please refer to FIGS. 20A to 20C, wherein FIG. 20A is a drawing illustrating a stage subsequent to FIG. 19A, FIG. 20B is a cross-sectional view taken along line I-I' in FIG. 20A, and FIG. 20C is a cross-sectional view taken along line II-II' in FIG. 20A. In operation 36, the barrier layer 208 is removed from the semiconductor layer 210 (i.e., the silicon germanium layer 210) after the annealing 225. Thus, the silicon germanium layer 210 is exposed through the trench 223.

Figure 21A:
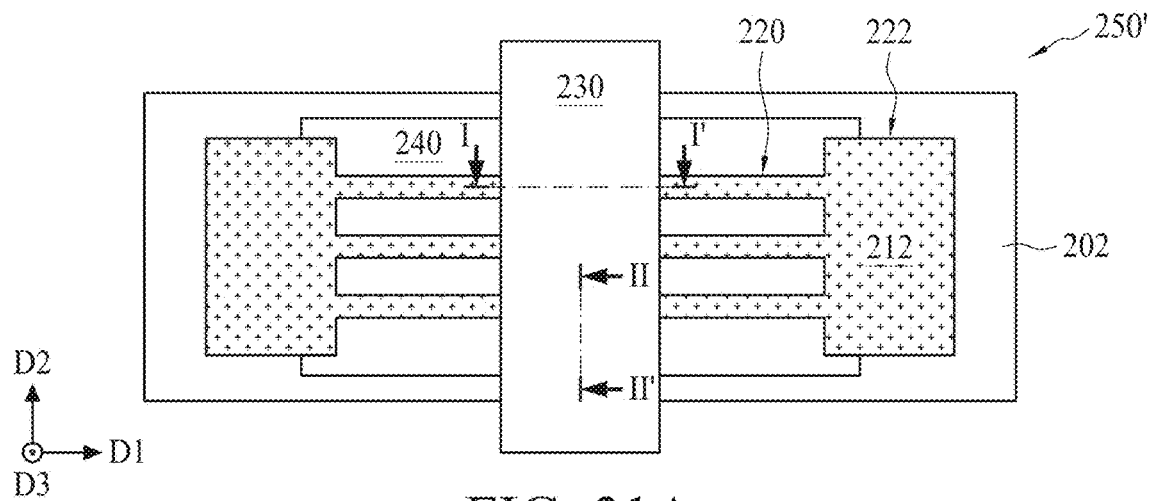
Figure 21B:
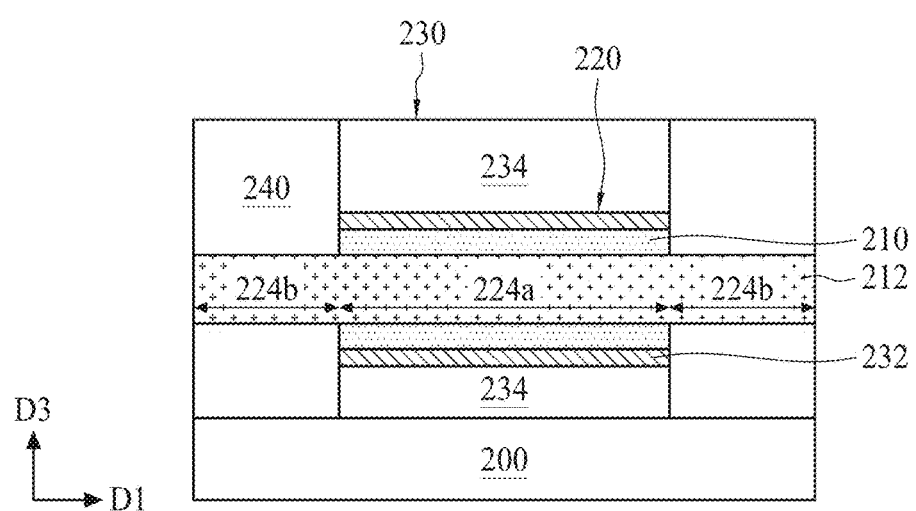
Figure 21C:
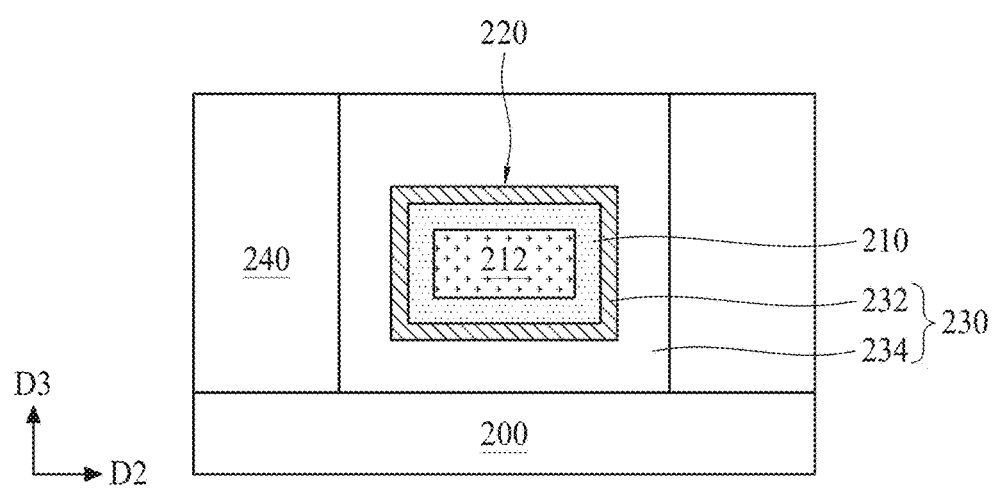

Referring to FIGS. 21A to 21C, wherein FIG. 21A is a drawing illustrating a stage subsequent to FIG. 20A, FIG. 21B is a cross-sectional view taken along line I-I' in FIG. 21A, and FIG. 21C is a cross-sectional view taken along line II-II' in FIG. 21A. In operation 37, a gate structure 230 is formed to surround the nanowires 220. In some embodiments, the gate structure 230 may be formed to surround a portion of each nanowire 220. Additionally, other portions of the nanowire 220 may be exposed through the gate structure 230. The gate structure 230 may include a high-k gate dielectric layer 232 and a metal gate electrode layer 234. In sine embodiments, an interfacial layer (IL) (not shown) may be formed between the high-k gate dielectric layer 232 and the nanowire 220. The gate structure 230 may be formed using an RPG approach. In such embodiments, a sacrificial gate (not shown) may be formed to surround the nanowire. Further, source/drain extensions and source/drain structures can be formed after the forming of the sacrificial gate, though not shown. In some embodiments, the source/drain structures can be a strained source/drain structure.

In some embodiments, portions of the silicon germanium layer 210 not covered by the sacrificial gate are removed, such that the silicon germanium layer 212 may be exposed through the trench 223. In some embodiments, a dielectric structure 240 is formed over the substrate 200. In some embodiments, the dielectric structure 240 can include an etch-stop layer (e.g., a contact etch stop layer (CESL) (not shown) and various dielectric layers (e.g., an inter-layer dielectric (ILD) layer) formed over the substrate 200 after the forming of the strained source/drain structures. Accordingly, the nanowires 220, the anchors 222, the sacrificial gate and the source/drain structures are embedded in the dielectric structure 240.

In some embodiments, the sacrificial gate is removed to form a gate trench (not shown). In such embodiments, the nanowires 220 may be exposed through in the gate trench. Further, the silicon germanium layer 210 may be exposed through in the gate trench. Subsequently, the high-k gate dielectric layer 232 is formed to surround each nanowire 220 exposed through the gate trench. As mentioned above, an IL may be formed prior to the forming of the high-k gate dielectric layer 232.

The metal gate electrode layer 234 is formed over the high-k gate dielectric layer 232. In some embodiments, the metal gate electrode layer 234 may include at least a barrier metal layer, a work functional metal layer and a gap-filling metal layer.

Accordingly, a GAA transistor 250' is obtained, as shown in FIGS. 21A to 21C. The transistor 250 has the single crystalline strain-relaxed silicon germanium layer 210 serving as the channel layer. The GAA transistor 250' includes the substrate 200 including the dielectric layer 202 disposed thereon. The nanowire 220 is disposed over the substrate 200. The GAA transistor 250' includes the metal gate electrode layer 234 and the gate dielectric layer 232. As shown in FIG. 21B, the nanowire 220 has a first portion 224a and a second portion 224b, wherein the first portion 224a of the nanowire 220 includes the semiconductor layer 212 and the semiconductor layer 210 surrounding the semiconductor layer 212. As mentioned above, the semiconductor layers 210 and 212 both include silicon and germanium, but a germanium concentration in the semiconductor layer 212 is less than a germanium concentration in the semiconductor layer 210. In such embodiments, an Ioff of the GAA transistor 250' is reduced. Additionally, a diameter of the first portion 224a of the nanowire 220 is greater than a diameter of the second portion 224b of the nanowire 220, as shown in FIG. 21B.

In summary, the present disclosure provides a method for forming a SiGe structure. In some embodiments, the SiGe structure is formed by forming an amorphous Ge layer on a Si layer. An anneal is subsequently performed. During the anneal, germanium atoms may diffuse into the silicon layer, thus forming a single crystalline strain-relaxed SiGe structure. According to the method, the Ge concentration can be determined by a ratio of a thickness of the Ge layer to a thickness of the Si layer. The SiGe structure formed by the method may have less impurity defect. Further, the SiGe structure formed by the method has less dislocation issue, and may be a strain-relaxed structure.

According to one embodiment of the present disclosure, a method of forming a semiconductor structure is disclosed. The method includes following operations. A substrate including a silicon (Si) layer is received. An amorphous germanium (Ge) layer is formed on the Si layer. A barrier layer is formed over the amorphous Ge layer. The substrate is annealed to transform the Si layer and the Ge layer to form a single crystalline SiGe layer. A Ge concentration has a positive correlation with a ratio of a thickness of the Ge layer to a thickness of the Si layer.

According to one embodiment of the present disclosure, a method for forming a semiconductor structure is provided. The method includes following operations. A substrate is received. A dielectric layer, a first semiconductor layer, a second semiconductor layer and a barrier layer are stacked over the substrate. The first semiconductor layer includes a first semiconductor material, and the second semiconductor layer includes a second semiconductor material different from the first semiconductor material. The substrate is annealed to form a third semiconductor layer including the first semiconductor material and the second semiconductor material. The barrier layer is removed. The third semiconductor layer is patterned to form at least a nanowire. A portion of the dielectric layer is removed to form a trench. The nanowire is suspended over the trench. A gate structure is formed in the trench. The gate structure surrounds a first portion of the nanowire and exposes a second portion of the nanowire.

According to one embodiment of the present disclosure, a semiconductor structure is provided. The semiconductor structure includes a substrate, a nanowire disposed over the substrate, a metal gate electrode layer and a gate dielectric layer. A dielectric layer is formed on the substrate. The nanowire has a first portion and a second portion. The nanowire has a first portion and a second portion, the first portion of the nanowire comprises a first semiconductor layer and a second semiconductor layer surrounded by the first semiconductor layer, the second portion comprises the second semiconductor layer. The metal gate electrode layer surrounds the first portion of the nanowire. The gate dielectric layer is disposed between the metal gate electrode layer and the nanowire.

According to one embodiment of the present disclosure, a semiconductor structure is provided. The semiconductor structure includes a nanowire disposed over a substrate, a gate electrode layer, a gate dielectric layer, and a semiconductor layer. The gate electrode layer surrounds a first section of the nanowire and exposing second sections of the nanowire. The gate dielectric layer is disposed between the gate electrode layer and the first section of the nanowire, and the semiconductor layer is disposed between the gate dielectric layer and the first section of the nanowire.

According to one embodiment of the present disclosure, a semiconductor structure is provided. The semiconductor structure includes a plurality of nanowires over a substrate, a gate electrode layer, a gate dielectric layer, and a pair of anchors over the substrate. The plurality of nanowires extend in a first direction and are arranged in a second direction different from the first direction. Each of the plurality of nanowires includes a first portion and a pair of second portions coupled to the first portion. The first portion includes a first semiconductor layer and a second semiconductor layer surrounded by the first semiconductor layer. The second portion include the second semiconductor layer. The gate electrode layer surrounds the first portions of the nanowires and exposes the pair of second portions of the nanowires. The gate dielectric layer is disposed between the gate electrode layer and the first sections of the nanowires. The pair of anchors are disposed at two ends of each nanowire, and coupled to the plurality of nanowires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate comprising at least a dielectric layer disposed thereon;
   a nanowire disposed over the substrate, wherein the nanowire has a first portion and a second portion, the first portion of the nanowire comprises a first semiconductor layer and a second semiconductor layer surrounded by the first semiconductor layer, the second portion comprises the second semiconductor layer;
   a metal gate electrode layer surrounding the first portion of the nanowire; and
   a gate dielectric layer disposed between the metal gate electrode layer and the nanowire, wherein the first semiconductor layer and the second semiconductor layer respectively comprises a first semiconductor material and a second semiconductor material, and a concentration of the second semiconductor material in the first semiconductor layer is greater than a concentration of the second semiconductor material in the second semiconductor layer.

2. The semiconductor structure of claim 1, wherein the second portions of the nanowire is at two sides of the first portion of the nanowire.

3. The semiconductor structure of claim 1, wherein a diameter of the second portion of the nanowire is less than a diameter of the first portion of the nanowire.

4. A semiconductor structure, comprising:
a nanowire disposed over a substrate;
a gate electrode layer surrounding a first section of the nanowire and exposing second sections of the nanowire;
a gate dielectric layer disposed between the gate electrode layer and the first section of the nanowire; and
a semiconductor layer between the gate dielectric layer and the first section of the nanowire, wherein the nanowire comprises a first semiconductor material and a second semiconductor material, and a lattice constant of the second semiconductor material is greater than a lattice constant of the first semiconductor material, and the semiconductor layer comprises the first semiconductor material and the second semiconductor material.

5. The semiconductor structure of claim 4, wherein a concentration of the second semiconductor material in the semiconductor layer is greater than a concentration of the second semiconductor material in the nanowire.

6. The semiconductor structure of claim 4, wherein the second sections of the nanowire are at two sides of the first section of the nanowire.

7. The semiconductor structure of claim 4, wherein a thickness of the semiconductor layer is less than a diameter of the nanowire.

8. The semiconductor structure of claim 4, further comprising an anchor disposed over the substrate, and the nanowire is coupled to the anchor.

9. The semiconductor structure of claim 8, wherein the anchor and the nanowire comprise same materials.

10. A semiconductor structure, comprising:
a plurality of nanowires over a substrate, wherein the plurality of nanowire extended in a first direction and arranged in a second direction different from the first direction, wherein each of the plurality of nanowires comprises:
a first portion comprising a first semiconductor layer and a second semiconductor layer surrounded by the first semiconductor layer; and
a pair of second portions coupled to the first portion and comprising the second semiconductor layer;
a gate electrode layer surrounding the first portions of the nanowires and exposing the pair of second portions of the nanowires;
a gate dielectric layer disposed between the gate electrode layer and the first portions of the nanowires; and
a pair of anchors over the substrate and at two ends of each nanowire, wherein the plurality of nanowires are coupled to the pair of anchors,
wherein the first semiconductor layer comprises a first semiconductor material and a second semiconductor material, and a lattice constant of the second semiconductor material is greater than a lattice constant of the first semiconductor material, and wherein the first semiconductor material comprises silicon, and the second semiconductor material comprises germanium.

11. The semiconductor structure of claim 10, wherein the first semiconductor layer comprises a crystal silicon germanium layer.

12. The semiconductor structure of claim 10, wherein the second semiconductor layer comprises the first semiconductor material and the second semiconductor material.

13. The semiconductor structure of claim 12, wherein a concentration of the second semiconductor material in the first semiconductor layer is greater than a concentration of the second semiconductor material in the second semiconductor layer.

14. The semiconductor structure of claim 10, wherein a thickness of the second semiconductor layer is greater than a thickness of the first semiconductor layer.

15. The semiconductor structure of claim 10, wherein a diameter of the first portion of the nanowire is greater than a diameter of each second portion of the nanowire.

16. The semiconductor structure of claim 1, further comprising a dielectric structure disposed over the substrate.

17. The semiconductor structure of claim 16, wherein the second portion of the nanowire is disposed in the dielectric structure.

18. The semiconductor structure of claim 1, wherein a thickness of the second semiconductor layer is greater than a thickness of the first semiconductor layer.

19. The semiconductor structure of claim 1, wherein the nanowire extends in a first direction, and the metal gate electrode layer and the gate dielectric layer extend in a second direction different from the first direction.

20. The semiconductor structure of claim 1, wherein the gate dielectric layer comprises a high-k gate dielectric layer.

* * * * *